US012784653B2

(12) United States Patent
Son

(10) Patent No.: US 12,784,653 B2
(45) Date of Patent: Nov. 3, 2026

(54) DISPLAY DEVICE

(71) Applicant: LG Display Co., Ltd., Seoul (KR)

(72) Inventor: HyeonHo Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/775,386

(22) Filed: Jul. 17, 2024

(65) Prior Publication Data

US 2025/0095556 A1 Mar. 20, 2025

(30) Foreign Application Priority Data

Sep. 20, 2023 (KR) ........................ 10-2023-0125525

(51) Int. Cl.

| | |
|---|---|
| ***G09G 3/32*** | (2016.01) |
| ***H10H 20/832*** | (2025.01) |
| ***H10H 20/857*** | (2025.01) |
| ***H10W 90/00*** | (2026.01) |

(52) U.S. Cl.

CPC ............ *G09G 3/32* (2013.01); *H10H 20/835* (2025.01); *H10H 20/857* (2025.01); *H10W 90/00* (2026.01); *G09G 2300/026* (2013.01); *G09G 2310/0267* (2013.01); *G09G 2310/08* (2013.01); *G09G 2330/10* (2013.01)

(58) Field of Classification Search

CPC ...... G09G 3/32; G09G 3/3233; G09G 3/3266; G09G 2300/026; G09G 2300/0426; G09G 2300/0809; G09G 2310/0267; G09G 2310/08; G09G 2330/10; H10L 25/0753; H10L 25/167; H10H 20/835; H10H 20/857; H10H 20/853; H10H 29/49; H10H 29/856; H10H 29/39; H10D 86/441

See application file for complete search history.

(56) References Cited

U.S. PATENT DOCUMENTS

| | | | |
|---|---|---|---|
| 7,129,914 B2 | 10/2006 | Knapp et al. | |
| 7,545,352 B2 | 6/2009 | Kwak et al. | |
| 2003/0117348 A1 | 6/2003 | Knapp et al. | |
| 2006/0022909 A1 | 2/2006 | Kwak et al. | |

(Continued)

FOREIGN PATENT DOCUMENTS

| | | |
|---|---|---|
| CN | 114283738 A | 4/2022 |
| JP | 2019-515339 A | 6/2019 |

(Continued)

OTHER PUBLICATIONS

Japan Patent Office, Office Action, Japanese Patent Application No. 2024-104958, Aug. 5, 2025, six pages.

*Primary Examiner* — Christopher E Leiby

(74) *Attorney, Agent, or Firm* — Fenwick & West LLP

(57) ABSTRACT

A display device includes a display panel in which a plurality of sub pixels is defined; a first light emitting diode which is disposed in each of the plurality of sub pixels; a second light emitting diode which is connected to the first light emitting diode in series; a first control transistor which is connected to the first light emitting diode in parallel and is turned on by a first control signal; and a second control transistor which is connected to the second light emitting diode in parallel and is turned on by a second control signal. Accordingly, the first light emitting diode and the second light emitting diode may be independently controlled using the first control transistor and the second control transistor.

11 Claims, 13 Drawing Sheets

(56) References Cited

U.S. PATENT DOCUMENTS

| | | | | |
|---|---|---|---|---|
| 2013/0207548 | A1* | 8/2013 | Leshniak | H05B 45/48 315/297 |
| 2017/0309224 | A1 | 10/2017 | Pappas et al. | |
| 2020/0135090 | A1* | 4/2020 | Lee | G09G 3/006 |
| 2021/0287579 | A1* | 9/2021 | Kang | G09G 3/32 |
| 2022/0101781 | A1* | 3/2022 | Baumheinrich | G09G 3/32 |
| 2022/0301500 | A1* | 9/2022 | Shigeta | G09G 3/32 |
| 2022/0415247 | A1* | 12/2022 | Liao | H01L 25/167 |
| 2023/0169926 | A1* | 6/2023 | Kim | G09G 3/3266 345/213 |
| 2024/0127745 | A1* | 4/2024 | Shin | H05B 47/16 |
| 2024/0185771 | A1* | 6/2024 | Chen | G09G 3/32 |

FOREIGN PATENT DOCUMENTS

| | | | |
|---|---|---|---|
| KR | 10-2004-0075019 | A | 8/2004 |
| KR | 10-2006-0010491 | A | 2/2006 |

* cited by examiner

DISPLAY DEVICE

CROSS-REFERENCE TO RELATED APPLICATIONS

This application claims the priority of Republic of Korea Patent Application No. 10-2023-0125525 filed on Sep. 20, 2023, which is incorporated by reference in its entirety.

FIELD

The present disclosure relates to a display device, and more particularly, to a display device using a light emitting diode (LED).

BACKGROUND

As display devices which are used for a monitor of a computer, a television, or a cellular phone, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast-lighting speed, excellent luminous efficiency, and a strong impact resistance so that a stability is excellent and an image having a high luminance may be displayed.

SUMMARY

An object to be achieved by the present disclosure is to provide a display device in which a dark spot defect of a sub pixel is reduced.

Another object to be achieved by the present disclosure is to provide a display device in which a plurality of light emitting diodes are disposed in a sub pixel to reduce the failure of the sub pixel.

Another object to be achieved by the present disclosure is to provide a display device in which a plurality of light emitting diodes are disposed in a sub pixel to display the image with a high resolution.

Still another object to be achieved by the present disclosure is to provide a display device in which even though an open defect or a short defect occurs in one light emitting diode, among a plurality of light emitting diodes connected in series, the remaining light emitting diodes are normally driven.

Still another object to be achieved by the present disclosure is to provide a display device in which when some light emitting diodes are defective, a path through which a driving current detours is provided.

Still another object to be achieved by the present disclosure is to provide a display device which adds a minimum number of transistors to control a plurality of light emitting diodes.

Objects of the present disclosure are not limited to the above-mentioned objects, and other objects, which are not mentioned above, can be clearly understood by those skilled in the art from the following descriptions.

According to an embodiment of the present disclosure, a display device includes a display panel in which a plurality of sub pixels are defined; a first light emitting diode which is disposed in each of the plurality of sub pixels; a second light emitting diode which is connected to the first light emitting diode in series; a first control transistor which is connected to the first light emitting diode in parallel and is turned on by a first control signal; and a second control transistor which is connected to the second light emitting diode in parallel and is turned on by a second control signal. Accordingly, the first light emitting diode and the second light emitting diode may be independently controlled using the first control transistor and the second control transistor which are connected to the first light emitting diode and the second light emitting diode, respectively, in parallel.

According to another aspect of the present disclosure, a display device includes: a substrate, an adhesive layer disposed on the substrate; a first light emitting diode which is disposed on the adhesive layer and includes a first anode and a first cathode; a second light emitting diode which is disposed on the adhesive layer and includes a second anode and a second cathode; a plurality of reflective electrodes disposed between the substrate and the adhesive layer. The plurality of reflective electrodes include a first reflective electrode which is electrically connected to the first anode; a second reflective electrode which is electrically connected to the first cathode and the second anode; and a third reflective electrode which is electrically connected to the second cathode. Accordingly, the first light emitting diode and the second light emitting diode may be connected in series using the plurality of reflective electrodes.

Other detailed matters of the exemplary embodiments are included in the detailed description and the drawings.

According to the present disclosure, a dark spot defect of a sub pixel is reduced to improve the reliability of the display device.

According to the present disclosure, a plurality of light emitting diodes are disposed in the sub pixel to display an image with a higher resolution.

According to the present disclosure, a plurality of light emitting diodes are disposed in the sub pixel and when some light emitting diode is defective, the remaining light emitting diodes are used to normally drive the sub pixel.

According to the present disclosure, even though some of the plurality of light emitting diodes which are connected in series is defective, the remaining light emitting diodes may be normally driven using a transistor through which a driving current detours.

According to the present disclosure, a control transistor is connected to each of the plurality of light emitting diodes in parallel to provide a path to allow a driving current to detour when some light emitting diode is defective.

According to the present disclosure, a control transistor is connected to each of the plurality of light emitting diodes in parallel to individually control the light emitting diodes.

According to the present disclosure, a minimum number of transistors are added to control the plurality of light emitting diodes.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
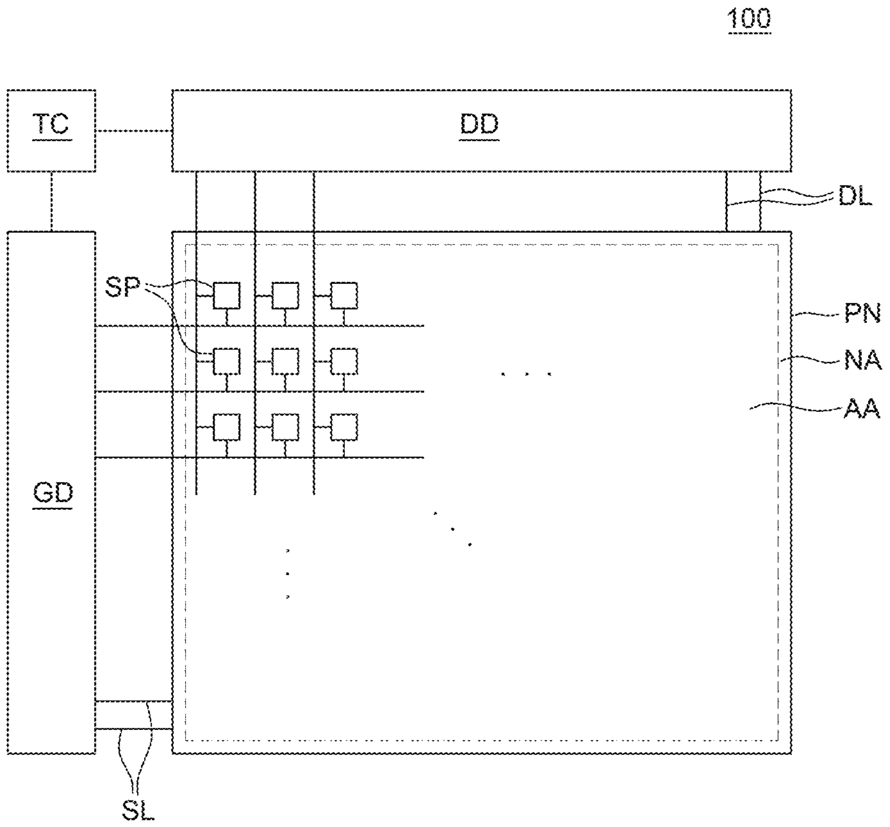
FIG. 1 is a schematic diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the exemplary embodiments of the present disclosure will be described in detail with reference to accompanying drawings.

Figure 2A:
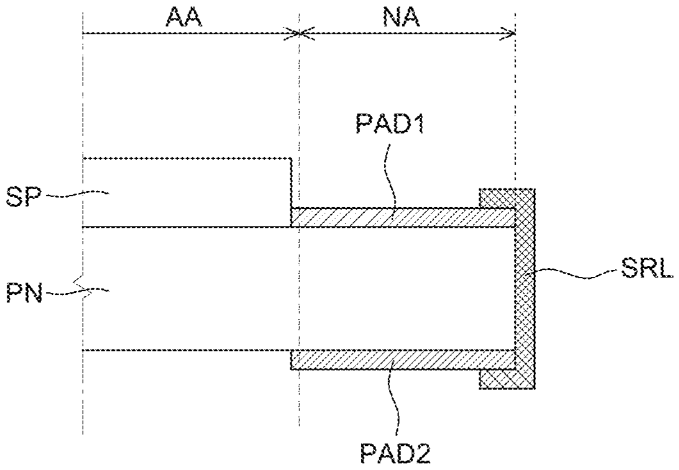
FIG. 2A is a partial cross-sectional view of a display device according to an exemplary embodiment of the present disclosure.
Figure 2B:
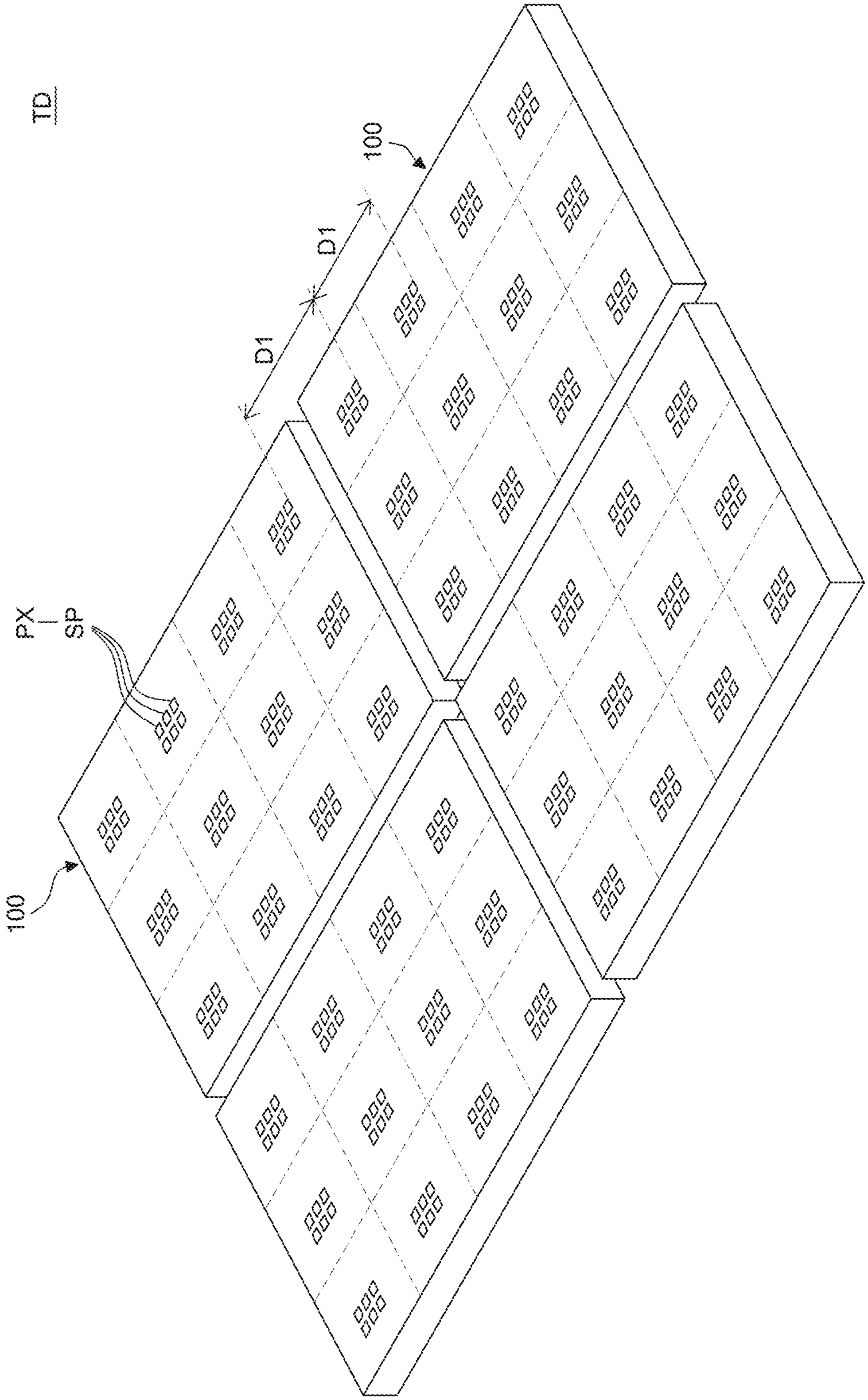
FIG. 2B is a perspective view of a tiling display device according to an exemplary embodiment of the present disclosure.

FIG. 1 is a schematic diagram of a display device according to an exemplary embodiment of the present disclosure. FIG. 2A is a partial cross-sectional view of a display device according to an exemplary embodiment of the present disclosure. FIG. 2B is a perspective view of a tiling display device according to an exemplary embodiment of the present disclosure. In FIG. 1, for the convenience of description, among various components of the display device 100, only a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL according to a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC into a data voltage Vdata using a reference gamma voltage in accordance with a plurality of data control signals supplied from the timing controller TC. The data driver DD may supply the converted data voltage Vdata to the plurality of data lines DL.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Further, the timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. Even though not illustrated in the drawings, each of the plurality of sub pixels SP may be connected to a high potential power line VDD, a low potential power line VSS, a reference line RL, and the like.

In the display panel PN, an active area AA and a non-active area NA enclosing the active area AA may be defined.

The active area AA is an area in which images are displayed in the display device 100. In the active area AA, a plurality of sub pixels SP which configure a plurality of pixels PX and a circuit for driving the plurality of sub pixels SP may be disposed. The plurality of sub pixels SP are a minimum unit which configures the active area AA and n sub pixels SP form one pixel PX. In each of the plurality of sub pixels SP, a light emitting diode LED and a thin film transistor for driving the light emitting diode LED may be disposed. The plurality of light emitting elements LED may be defined in different ways depending on the type of the display panel PN. For example, when the display panel PN is an inorganic light emitting display panel, the light emitting diode LED may be a light emitting diode (LED) or a micro light emitting diode (LED).

In the active area AA, a plurality of wiring lines which transmits various signals to the plurality of sub pixels SP are disposed. For example, the plurality of wiring lines may include a plurality of data lines DL which supply a data voltage Vdata to each of the plurality of sub pixels SP, a plurality of scan lines SL which supply a scan signal to each of the plurality of sub pixels SP, and the like. The plurality of scan lines SL extend to one direction in the active area AA to be connected to the plurality of sub pixels SP and the plurality of data lines DL extend to a direction different from the one direction in the active area AA to be connected to the plurality of sub pixels SP. In addition, in the active area AA, a low potential power line VSS, a high potential power line VDD, etc. may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

In the meantime, the non-active area NA may be located on a rear surface of the display panel PN, that is, a surface on which the sub pixels SP are not disposed or may be omitted, and is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board. The data driver DD and the timing controller TC are electrically connected to the display panel PN by bonding the flexible film and the printed circuit board to the pad electrode formed in the non-active area NA of the display panel PN.

If the gate driver GD is mounted in the GIP manner and the data driver DD and the timing controller TC transmit a signal to the display panel PN through a pad electrode of the non-active area NA, an area of the non-active area NA for disposing the gate driver GD and the pad electrode is necessary a predetermined level or more. Accordingly, a bezel may be increased.

In contrast, when the gate driver GD is mounted in the active area AA in the GIA manner and a side line SRL which connects the signal line on the front surface of the display panel PN to the pad electrode on a rear surface of the display panel PN is formed to bond the flexible film and the printed circuit board onto a rear surface of the display panel PN, the non-active area NA may be minimized on the front surface of the display panel PN. That is, when the gate driver GD, the data driver DD, and the timing controller TC are connected to the display panel PN as described above, a zero bezel with substantially no bezel may be implemented.

Specifically, referring to FIGS. 2A and 2B, in the non-active area NA of the display panel PN, a plurality of pad electrodes for transmitting various signals to the plurality of sub pixels SP is disposed. For example, in a non-active area NA on the front surface of the display panel PN, a first pad electrode PAD1 which transmits a signal to the plurality of sub pixels SP is disposed. In a non-active area NA on the rear surface of the display panel PN, a second pad electrode PAD2 which is electrically connected to a driving component, such as a flexible film and the printed circuit board, is disposed. That is, on the front surface of the display panel PN on which images are displayed, only a pad area of the non-active area NA in which the first pad electrode PAD1 is disposed may be formed at minimum.

In this case, even though it is not illustrated in the drawing, various signal lines connected to the plurality of sub pixels SP, for example, a scan line SL or a data line DL extends from the active area AA to the non-active area NA to be electrically connected to the first pad electrode PAD1.

Further, the side line SRL is disposed along a side surface of the display panel PN. The side line SRL may electrically connect the first pad electrode PAD1 on the front surface of the display panel PN and the second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize or reduce an area of the non-active area NA on the front surface of the display panel PN.

Referring to FIG. 2B, a tiling display device TD having a large screen size may be implemented by connecting a plurality of display devices 100. At this time, as illustrated in FIG. 2A, when the tiling display device TD is implemented using a display device 100 with a minimized bezel, a seam area in which an image between the display devices 100 is not displayed is minimized so that a display quality may be improved.

For example, the plurality of sub pixels SP forms one pixel PX and a distance D1 between an outermost pixel PX of one display device 100 and an outermost pixel PX of another display device 100 adjacent to one display device may be implemented to be equal to a distance D1 between pixels PX in one display device 100. Accordingly, a constant distance D1 between pixels PX between the display devices 100 is configured to minimize the seam area.

However, FIGS. 2A and 2B are illustrative so that the display device 100 according to the exemplary embodiment of the present disclosure may be a general display device with a bezel, but is not limited thereto.

Figure 3:
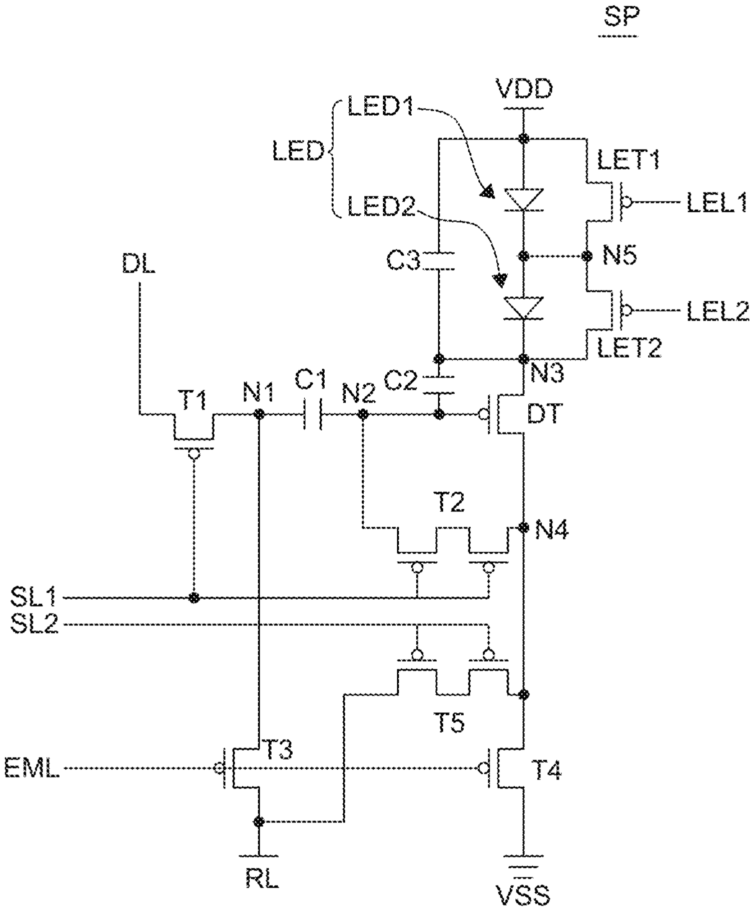
FIG. 3 is a circuit diagram of a sub pixel of a display device according to an exemplary embodiment of the present disclosure.
Figure 4A:
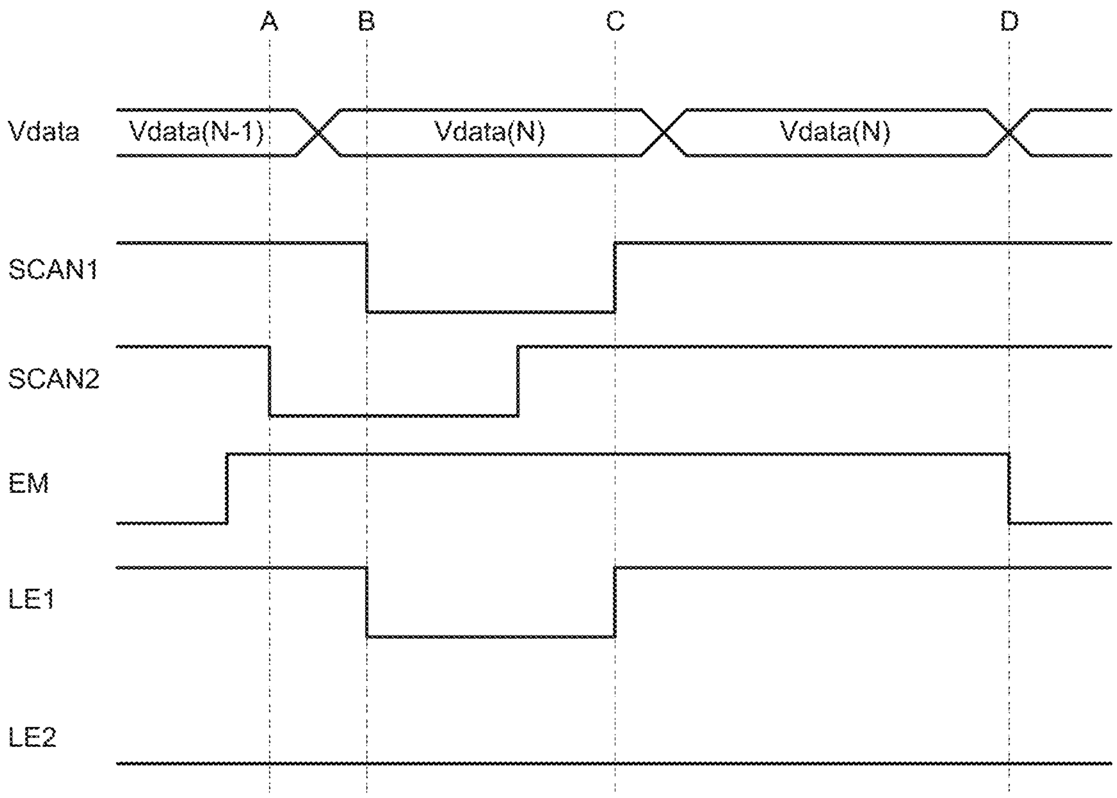
FIG. 4A is a driving timing diagram of a sub pixel of a display device when a first light emitting diode emits light according to an exemplary embodiment of the present disclosure.
Figure 4B:
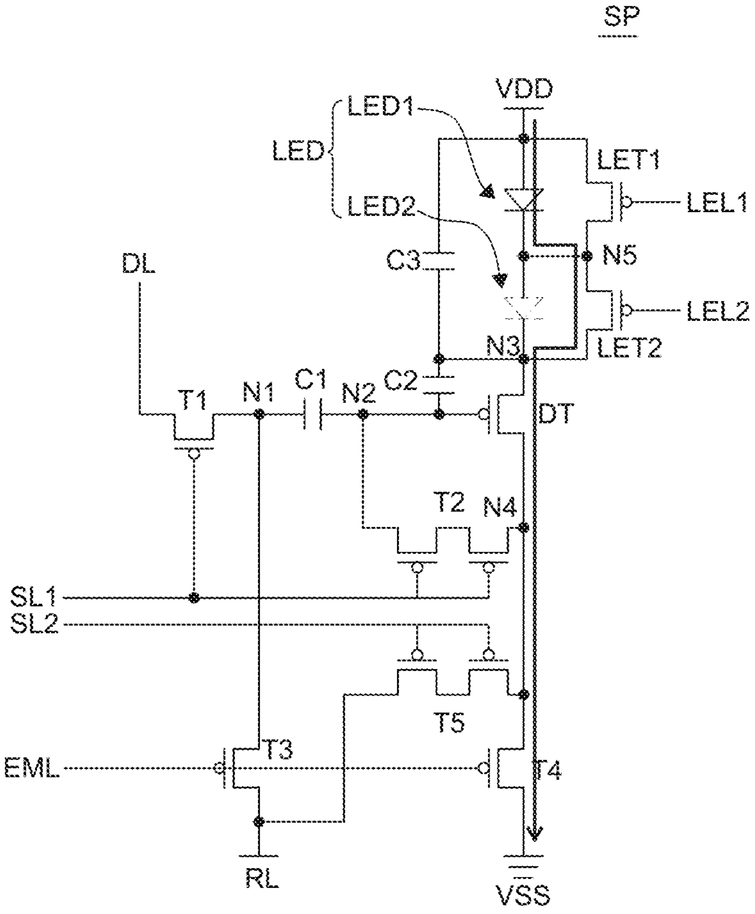
FIG. 4B is a circuit diagram of a sub pixel of a display device to explain a flow of a driving current when a first light emitting diode emits light according to an exemplary embodiment of the present disclosure.
Figure 5A:
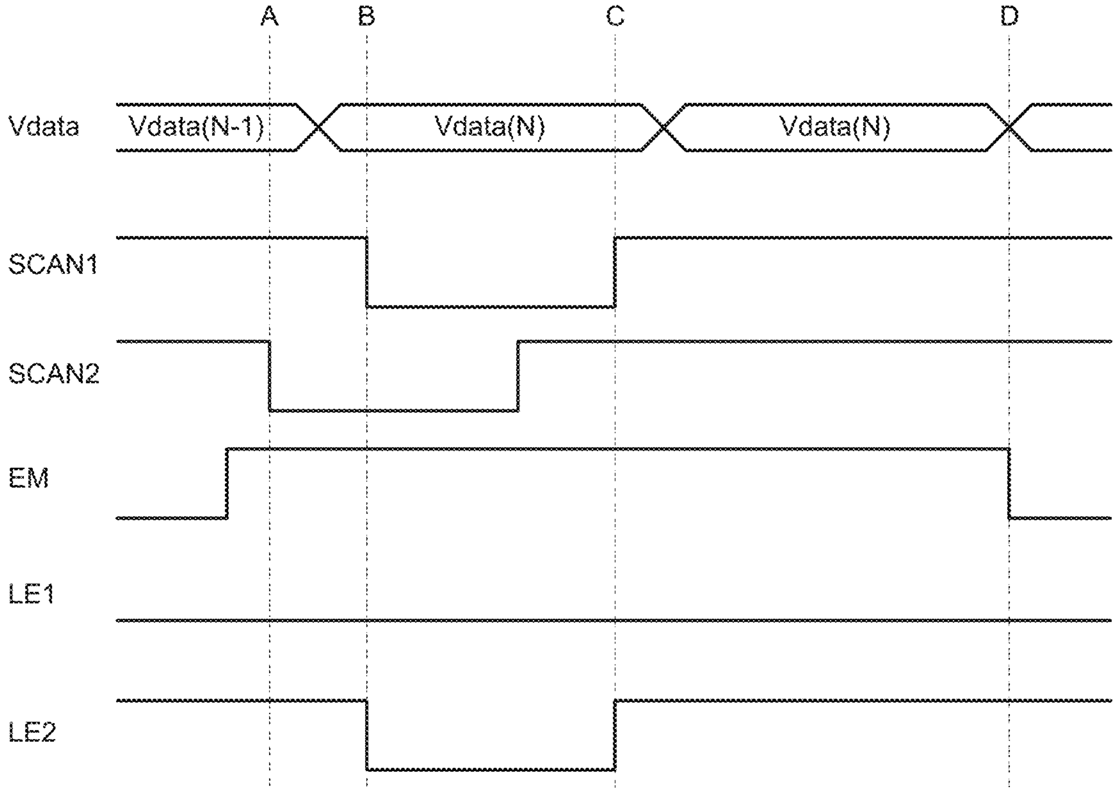
FIG. 5A is a driving timing diagram of a sub pixel of a display device when a second light emitting diode emits light according to an exemplary embodiment of the present disclosure.
Figure 5B:
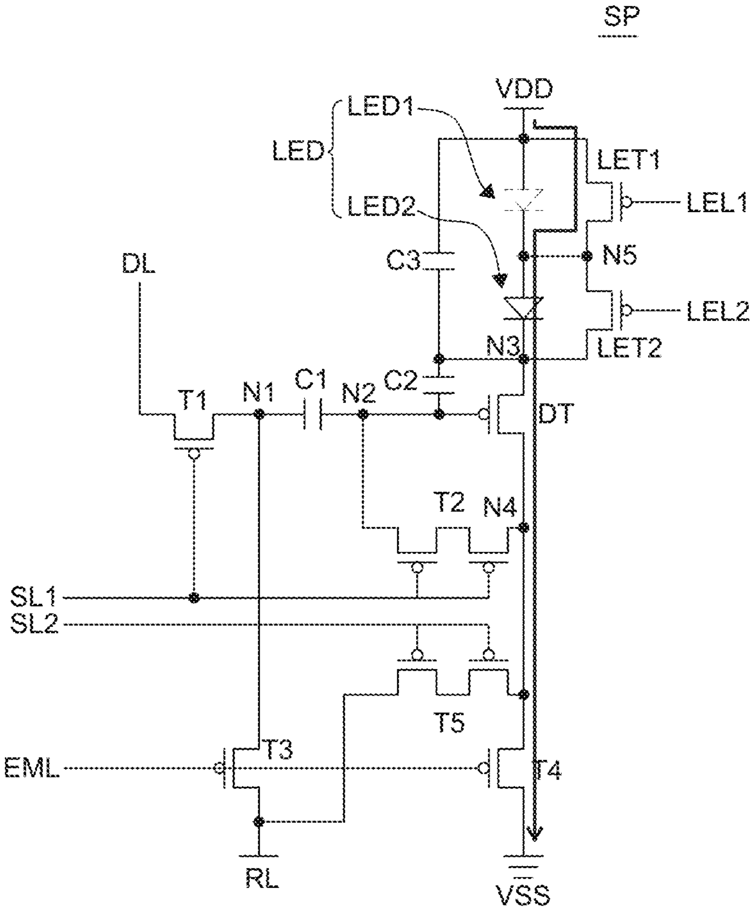
FIG. 5B is a circuit diagram of a sub pixel of a display device to explain a flow of a driving current when a second light emitting diode emits light according to an exemplary embodiment of the present disclosure.

FIG. 3 is a circuit diagram of a sub pixel of a display device according to an exemplary embodiment of the present disclosure. FIG. 4A is a driving timing diagram of a sub pixel of a display device when a first light emitting diode emits light according to an exemplary embodiment of the present disclosure. FIG. 4B is a circuit diagram of a sub pixel of a display device to explain a flow of a driving current when a first light emitting diode emits light according to an exemplary embodiment of the present disclosure. FIG. 5A is a driving timing diagram of a sub pixel of a display device when a second light emitting diode emits light according to an exemplary embodiment of the present disclosure. FIG. 5B is a circuit diagram of a sub pixel of a display device to explain a flow of a driving current when a second light emitting diode emits light according to an exemplary embodiment of the present disclosure.

Referring to FIG. 3, a sub pixel SP of a display device 100 according to the exemplary embodiment of the present disclosure includes a pixel circuit including a driving transistor DT, a first transistor T1, a second transistor T2, a third transistor T3, a fourth transistor T4, a fifth transistor T5, a first control transistor LET1, a second control transistor LET2, a first capacitor C1, a second capacitor C2, and a third capacitor C3 and a first light emitting diode LED1 and a second light emitting diode LED2 connected to the pixel circuit.

Each of the plurality of sub pixels SP is electrically connected to a first scan line SL1, a second scan line SL2, a data line DL, an emission control line EML, a reference line RL, a first control line LEL1, a second control line LEL2, a high potential power line VDD, and a low potential power line VSS.

In the meantime, the plurality of transistors of the plurality of sub pixels SP may be formed by different types of transistors. For example, one transistor among the plurality of transistors may be a transistor having an oxide semiconductor as an active layer. The oxide semiconductor material has a low off-current so that the oxide semiconductor material is appropriate for a switching transistor which maintains a short turn-on time and a long turn-off time. As another example, the other transistor among the plurality of transistors may be a transistor having low temperature poly-silicon (LTPS) as an active layer. The poly-silicon material has a high mobility to have a low power consumption and excellent reliability so that it may be appropriate for the driving transistor DT.

Further, a plurality of transistors disposed in each of the plurality of sub pixels SP may be an N-type transistor or a P-type transistor. In the N-type transistor, carriers are electrons so that electrons flow from the source electrode to the drain electrode and currents flow from the drain electrode to the source electrode. In the P-type transistor, carriers are holes so that holes flow from the source electrode to the drain electrode and currents flow from the source electrode to the drain electrode. For example, one of the plurality of transistors may be an N-type transistor and the other one of the plurality of transistors may be a P-type transistor.

Hereinafter, even though it is assumed that the plurality of transistors is P-type transistors, the plurality of transistors may be N-type transistors or include both the P-type transistor and the N-type transistor, but the present disclosure is not limited thereto.

The driving transistor DT is a transistor which controls a driving current based on the data voltage Vdata. A driving gate electrode DGE of the driving transistor DT is connected to a second node N2, a driving source electrode DSE is connected to a third node N3, and a driving drain electrode DDE is connected to a fourth node N4. The driving transistor DT may control a driving current applied to the light emitting diode LED in accordance with a gate-source voltage Vgs.

The first transistor T1 is a transistor which transmits the data voltage Vdata to the sub pixel SP. A first gate electrode GE1 of the first transistor T1 is connected to the first scan line SL1, a first source electrode SE1 is connected to the data line DL, and a first drain electrode DE1 is connected to the first node N1. The first transistor T1 is turned on by a first scan signal SCAN1 to supply the data voltage Vdata to the first node N1 from the data line DL.

The second transistor T2 is a transistor which samples and compensate for a threshold voltage of the driving transistor DT. A second gate electrode GE2 of the second transistor T2 is connected to the first scan line SL1 and a second source electrode SE2 and a second drain electrode DE2 are connected to the second node N2 and the fourth node N4, respectively. The second transistor T2 is turned on by the first scan signal SCAN1 to connect the driving gate electrode DGE and the driving drain electrode DDE of the driving transistor DT. Therefore, when the second transistor T2 is turned on, the driving transistor DT may be in a diode-connection state in which the driving gate electrode DGE and the driving drain electrode DDE are short circuited to operate as a diode.

The third transistor T3 is a transistor which initializes the first node N1 to a reference voltage. A third gate electrode GE3 of the third transistor T3 is connected to the emission control line EML, a third source electrode SE3 is connected to the reference line RL, and a third drain electrode DE3 is connected to the first node N1. The third transistor T3 is turned on by the emission control signal EM to transmit the reference voltage to the first node N1.

The fourth transistor T4 is a transistor which controls a flow of the driving current. A fourth gate electrode GE4 of the fourth transistor T4 is connected to the emission control line EML, a fourth source electrode SE4 is connected to the fourth node N4, and a fourth drain electrode DE4 is connected to the low potential power line VSS. The fourth transistor T4 is turned on by the emission control signal EM to connect the fourth node N4 and the low potential power line VSS and allows the driving current to flow from the high potential power line VDD to the low potential power line VSS.

The fifth transistor T5 is a transistor which initializes the fourth node N4 to the reference voltage. A fifth gate electrode GE5 of the fifth transistor T5 is connected to the second scan line SL2, a fifth source electrode SE5 is connected to the reference line RL, and a fifth drain electrode DE5 is connected to the fourth node N4. The fifth transistor T5 is turned on by the second scan signal SCAN2 to transmit the reference voltage to the fourth node N4. Accordingly, a voltage of the driving drain electrode DDE of the driving transistor DT may be initialized to the reference voltage by the fifth transistor T5.

The first control transistor LET1 is a transistor which controls whether the first light emitting diode LED1 emits light. A first control gate electrode EGE1 of the first control transistor LET1 is connected to a first control line LEL1 and a first control source electrode ESE1 is connected to a first anode AD1 of the first light emitting diode LED1 and the high potential power line VDD. A first control drain electrode EDE1 is connected to a first cathode CD1 of the first light emitting diode LED1 and a fifth node N5. The first control transistor LET1 and the first light emitting diode LED1 may be connected in parallel.

The first control transistor LET1 is turned on by the first control signal LE1 of the first control line LEL1 to allow the driving current to flow to the first control transistor LET1, rather than the first light emitting diode LED1. That is, when the first control transistor LET1 is turned on, the driving current does not flow to the first light emitting diode LED1, but detour to the turned on first control transistor LET1. When the first control transistor LET1 is turned on, the driving current may detour from the first control source electrode ESE1 of the first control transistor LET1 to the first control drain electrode EDE1. In contrast, when the first control transistor LET1 is turned off, the driving current may flow from the first anode AD1 of the first light emitting diode LED1 to the first cathode CD1. Accordingly, only when the first control transistor LET1 is turned off, the first light emitting diode LED1 may emit light.

The second control transistor LET2 is a transistor which controls whether the second light emitting diode LED2 emits light. A second control gate electrode EGE2 of the second control transistor LET2 is connected to a second control line LEL2 and a second control source electrode ESE2 is connected to a second anode AD2 of the second light emitting diode LED2 and the fifth node N5. A second control drain electrode EDE2 is connected to a second cathode CD2 of the second light emitting diode LED2 and the third node N3. The second control transistor LET2 and the second light emitting diode LED2 may be connected in parallel.

The second control transistor LET2 is turned on by the second control signal LE2 of the second control line LEL2 to allow the driving current to flow to the second control transistor LET2, rather than the second light emitting diode LED2. When the second control transistor LET2 is turned on, the driving current may detour from the second control source electrode ESE2 of the second control transistor LET2 to the second control drain electrode EDE2. When the second control transistor LET2 is turned off, the driving current may flow from the second anode AD2 of the second light emitting diode LED2 to the second cathode CD2. Accordingly, only when the second control transistor LET2 is turned off, the second light emitting diode LED2 may emit light.

The first capacitor C1 is connected between the first node N1 and the second node N2. The first capacitor C1 includes a plurality of first capacitor electrodes. Some of the plurality of first capacitor electrodes are connected to the first node N1 and the others are connected to the second node N2. Further, the first capacitor C1 is charged with the data voltage Vdata to which a threshold voltage of the driving transistor DT is reflected to fix a voltage applied to the driving gate electrode DGE of the driving transistor DT while the first light emitting diode LED1 or the second light emitting diode LED2 emit light. By doing this, a constant driving current may be supplied to the first light emitting diode LED1 or the second light emitting diode LED2 during one frame.

The second capacitor C2 is connected between the second node N2 and the third node N3. The second capacitor C2 includes a plurality of second capacitor electrodes. Some of the plurality of second capacitor electrodes are connected to the second node N2 and the others are connected to the third node N3. The second capacitor C2 may be connected between the driving gate electrode DGE and the driving source electrode DSE of the driving transistor DT.

In the meantime, when a voltage fluctuates in the first node N1, a voltage of the second node N2 may also fluctuate by a coupling characteristic of the first capacitor C1. At this time, the second capacitor C2 which is connected to the first capacitor C1 in series is in a state coupled to the first capacitor C1 so that a transmission rate of transmitting a voltage of the first node N1 to the voltage of the second node N2 according to a capacitance ratio of the first capacitor C1 and the second capacitor C2 may vary. Therefore, when the light emitting diode LED is configured by a micro-LED with a large slope of the I-V curve, the second capacitor C2 is connected to the first capacitor C1 to lower a transmission rate of the data voltage Vdata which is transmitted from the first node N1 to the second node N2. Further, a more delicate gray scale level may be expressed.

The third capacitor C3 is a capacitor formed between the high potential power line VDD and the third node N3 and may be a parasitic capacitor. The third capacitor C3 may be a capacitor formed between existing configurations without additionally forming a separate electrode. For example, at least a part of a configuration connected to the high potential power line VDD and at least a part of a configuration connected to the third node N3 overlap each other to form the third capacitor C3. The third capacitor C3 increases an intrinsic capacitance in the light emitting diode LED to allow the light emitting diode LED to emit light with higher luminance.

The first light emitting diode LED1 includes a first anode AD1 and a first cathode CD1. The first anode AD1 of the first light emitting diode LED1 is connected to the high potential power line VDD and the first cathode CD1 is connected to the fifth node N5. The first light emitting diode LED1 is supplied with a driving current which is set by a turned-on driving transistor DT in a turned-off state of the first control transistor LET1 to emit light.

The second light emitting diode LED2 is connected to the first light emitting diode LED1 in series and includes a second anode AD2 and a second cathode CD2. The second anode AD2 of the second light emitting diode LED2 is connected to the fifth node N5 and the second cathode CD2 is connected to the third node N3. The second light emitting diode LED2 is supplied with a driving current which is set by a turned-on driving transistor DT in a turned-off state of the second control transistor LET2 to emit light.

The first light emitting diode LED1 and the second light emitting diode LED2 may be driven by turns. The first light emitting diode LED1 and the second light emitting diode LED2 may emit light in different frames or different horizontal periods. For example, the first light emitting diode LED1 emits light in an n-th frame and the second light emitting diode LED2 may emit light in a m-th frame. For example, the first light emitting diode LED1 may emit light in an n-th horizontal period and the second light emitting diode LED2 may emit light in a m-th horizontal period. In this case, the first control transistor LET1 and the second control transistor LET2 may be also turned on by turns. That is, the first control transistor LET1 and the second control transistor LET2 are turned on in different frames and control the first light emitting diode LED1 and the second light emitting diode LED2 to emit light in different periods.

Accordingly, in the display device 100 according to the exemplary embodiment of the present disclosure, the first light emitting diode LED1 and the second light emitting diode LED2 which are connected to the plurality of sub pixels SP in series, the first control transistor LET1 which is connected to the first light emitting diode LED1 in parallel, and the second control transistor LET2 which is connected to the second light emitting diode LED2 in parallel are formed. Therefore, even though a defect occurs in the sub pixel SP, it is seen that the sub pixel SP is normally driven. For example, an open defect or a short defect occurs, the driving current detours the first control transistor LET1 to be supplied to the second light emitting diode LED2 and the second light emitting diode LED2 may be normally driven. The open defect is a defect that a part of the first anode AD1 and the first cathode CD1 of the first light emitting diode LED1 is not connected to the circuit. The short defect is a defect that the first anode AD1 and the first cathode CD1 of the first light emitting diode LED1 are electrically connected to each other. Likewise, even though the open defect or the short defect occurs in the second light emitting diode LED2, the second control transistor LET2 may form a current path between the driving transistor DT and the first light emitting diode LED1. That is, when the second light emitting diode LED2 is defective, the driving current detours the second control transistor LET2 and the first light emitting diode LED1 may be normally driven. Accordingly, in the display device 100 according to the exemplary embodiment of the present disclosure, even though any one of the plurality of light emitting diodes LED disposed in each of the plurality of sub pixels SP is defective, the sub pixel SP may be driven using the remaining light emitting diodes LED. Therefore, the dark spot defect may be minimized and the reliability of the display device 100 may be improved.

Further, as described above, the first light emitting diode LED1 and the second light emitting diode LED2 may emit light by turns in the unit of frames or in the unit of horizontal periods. If the first light emitting diode LED1 is defective so that the first light emitting diode LED1 does not emit light, the second light emitting diode LED2 emits light in another frame or another horizontal period, so that the sub pixel SP does not look like a dark spot. Specifically, when the display device 100 is driven at a high frequency, a length of one frame or a length of a horizontal period is very short so that it is difficult for a user to recognize a non-emission defect of the first light emitting diode LED1 or the second light emitting diode LED2. Accordingly, the first light emitting diode LED1 and the second light emitting diode LED2 emit light by turns. Even though one light emitting diode LED is defective so as not to emit light, the remaining light emitting diode LED emits light to normally display an image.

Hereinafter, the driving process of the sub pixel SP will be described in detail by assuming that the first light emitting diode LED1 and the second light emitting diode LED2 emit light by turns in the unit of frames.

Referring to FIGS. 4A and 4B together, a low level of second scan signal SCAN2 is output to the second scan line SL2 at a time A. The fifth transistor T5 is turned on by the low level of second scan signal SCAN2 and the reference voltage is applied to the driving drain electrode DDE of the driving transistor DT which is the fourth node N4. Accordingly, a voltage of the driving drain electrode DDE of the driving transistor DT may be initialized to the reference voltage at the time A.

Next, a low level of first scan signal SCAN1 is output to the first scan line SL1 in a period between a time B and a time C. The first transistor T1 is turned on by the low level of first scan signal SCAN1 to transmit the data voltage Vdata to the first node N1. Further, the second transistor T2 is turned on by the low level of first scan signal SCAN1 to connect the driving gate electrode DGE and the driving drain electrode DDE of the driving transistor DT.

Further, low levels of first control signal LE1 and second control signal LE2 are output to both the first control line LEL1 and the second control line LEL2 during a period between the time B and the time C. At the time B, the high potential power line VDD and the driving source electrode DSE of the driving transistor DT may be electrically connected. At the time B, the high potential power line VDD is connected to the driving source electrode DSE of the driving transistor DT which is in a diode connection state by the second transistor T2 so that the current flows the driving transistor DT and the threshold voltage of the driving transistor DT may be sampled. Accordingly, the threshold voltage of the driving transistor DT is sampled to be reflected to the second node N2 and the data voltage Vdata to which the threshold voltage of the driving transistor DT is reflected may be charged to the first capacitor C1.

Next, the low level of emission control signal EM is output to the emission control line EML at the time D. The third transistor T3 is turned on by the low level of emission control signal EM and the reference voltage may be applied to the first node N1.

The fourth transistor T4 is turned on by the low level of emission control signal EM, the driving transistor DT and the low potential power line VSS may be electrically connected and the driving current may flow to the first light emitting diode LED1 or the second light emitting diode LED2.

Referring to FIGS. 4A and 4B, when it is the turn of the first light emitting diode LED1, between the first light emitting diode LED1 and the second light emitting diode LED2, to emit light, a high level of first control signal LE1 is output to the first control line LEL1 and a low level of second control signal LE2 is output to the second control line LEL2. That is, the first control signal LE1 which turns off the first control transistor LET1 is output to the first control line LEL1 and the second control signal LE2 which turns on the second control transistor LET2 is output to the second control line LEL2.

As the first control transistor LET1 is turned off, the driving current may flow to the first light emitting diode LED1 which is connected to the first control transistor LET1 in parallel. Further, as the second control transistor LET2 is turned on, the driving current may flow to the second control transistor LET2. Accordingly, the first control transistor LET1 is turned off between the high potential power line VDD and the fifth node N5 to flow the driving current to the first light emitting diode LED1 which is connected to the first control transistor LET1 in parallel. The second control transistor LET2 is turned on between the fifth node N5 and the third node N3 to flow the driving current to the second control transistor LET2. Accordingly, when the first control transistor LET1 is turned off and the second control transistor LET2 is turned on, the first light emitting diode LED1 emits light and the second light emitting diode LED2 does not emit light.

Next, referring to FIGS. 5A and 5B, when it is the turn of the second light emitting diode LED2, between the first light emitting diode LED1 and the second light emitting diode LED2, to emit light, a low level of first control signal LE1 is output to the first control line LEL1 and a high level of second control signal LE2 is output to the second control line LEL2. That is, the first control signal LE1 which turns on the first control transistor LET1 is output to the first control line LEL1 and the second control signal LE2 which turns off the second control transistor LET2 is output to the second control line LEL2.

As the first control transistor LET1 is turned on, the driving current detours to the first control transistor LET1 to flow. Further, as the second control transistor LET2 is turned off, the driving current may flow to the second light emitting diode LED2. Accordingly, the first control transistor LET1 is turned on between the high potential power line VDD and the fifth node N5 to flow the driving current to the first control transistor LET1. The second control transistor LET2 is turned off between the fifth node N5 and the third node N3 to flow the driving current to the second light emitting diode LED2 which is connected to the second control transistor LET2 in parallel. Accordingly, when the first control transistor LET1 is turned on and the second control transistor LET2 is turned off, the first light emitting diode LED1 does not emit light and the second light emitting diode LED2 may emit light.

Accordingly, in the display device 100 according to the exemplary embodiment of the present disclosure, the first control transistor LET1 and the second control transistor LET2 which are connected to the first light emitting diode LED1 and the second light emitting diode LED2 in parallel, respectively, are formed to easily control the first light emitting diode LED1 and the second light emitting diode LED2 to emit light. The first light emitting diode LED1 and the first control transistor LET1 are connected in parallel and when the first control transistor LET1 is turned off, the driving current flows to the first light emitting diode LED1 so that the first light emitting diode LED1 emits light. In contrast, when the first control transistor LET1 is turned on, the driving current detours to the first control transistor LET1 so that the first light emitting diode LED1 does not emit light. Only when the second control transistor LET2 connected to the second light emitting diode LED2 in parallel is turned off, the second light emitting diode LED2 emits light. Accordingly, the first light emitting diode LED1 and the second light emitting diode LED2 selectively emit light using the first control transistor LET1 and the second control transistor LET2 which are connected to the first light emitting diode LED1 and the second light emitting diode LED2 in parallel, respectively. Further, in order to independently control the first light emitting diode LED1 and the second light emitting diode LED2, only the first control transistor LET1 and the second control transistor LET2 are added at least instead of a complex circuit, so that the configuration of the sub pixel SP may be simplified.

Further, in the display device 100 according to the exemplary embodiment of the present disclosure, the first control transistor LET1 and the second control transistor LET2 which are connected to the first light emitting diode LED1 and the second light emitting diode LED2 in parallel, respectively, are formed. Therefore, even though one light emitting diode LED is defective, the remaining light emitting diode LED may be normally driven. For example, when an open defect occurs in the first light emitting diode LED1, between the first light emitting diode LED1 and the second light emitting diode LED2 which are connected in series, it may be difficult to flow the driving current to the second light emitting diode LED2. However, in the display device 100 according to the exemplary embodiment of the present disclosure, the first control transistor LET1 which is connected to the first light emitting diode LED1 in parallel is turned on to form a path through which the driving current detours and the driving current is normally supplied to the second light emitting diode LED2. Therefore, even though some light emitting diode LED is defective, the driving current may be normally supplied to the remaining light emitting diode LED using a control transistor which is connected to the light emitting diode LED in parallel.

Further, in the display device 100 according to the exemplary embodiment of the present disclosure, a plurality of light emitting diodes LED are disposed in one sub pixel SP so that an image with a high resolution may be easily displayed. For example, one light emitting diode LED is disposed in each of the plurality of sub pixels SP and the image with a high resolution may be displayed by increasing the number of the plurality of sub pixels SP. However, in this case, an area assigned to each of the plurality of sub pixels SP is reduced so that it is difficult to design the sub pixel SP. In contrast, in the display device 100 according to the exemplary embodiment of the present disclosure, a plurality of light emitting diodes LED are disposed in each of the plurality of sub pixels SP so that the image with a high resolution may be displayed without increasing the number of the plurality of sub pixels SP. That is, the number of light emitting diodes LED is increased so that the same effect as increasing the number of sub pixels SP may be obtained. At this time, the number of sub pixels SP is the same and only the number of light emitting diodes LED is increased so that an area for designing each of the sub pixels SP is ensured and the sub pixel SP may be more easily designed.

In the meantime, referring to FIG. 4A, when the first light emitting diode LED1 emits light, the first control signal LE1 which is applied to the first control line LEL1 may have the same waveform as the first scan signal SCAN1. Further, referring to FIG. 5A, when the second light emitting diode LED2 emits light, the second control signal LE2 which is applied to the second control line LEL2 may have the same waveform as the first scan signal SCAN1. In the display device 100 according to the exemplary embodiment of the present disclosure, a control signal generating circuit LEC is connected to each of a plurality of first stages ST1 which generates the first scan signal SCAN1 to output any one of the first control signal LE1 and the second control signal LE2 to have the same waveform as the first scan signal SCAN1. This will be described in more detail with reference to FIGS. 8 to 10 below.

Hereinafter, a structure of a sub pixel SP of the display device 100 according to the exemplary embodiment of the present disclosure will be described with reference to FIGS. 6 and 7.

Figure 6:
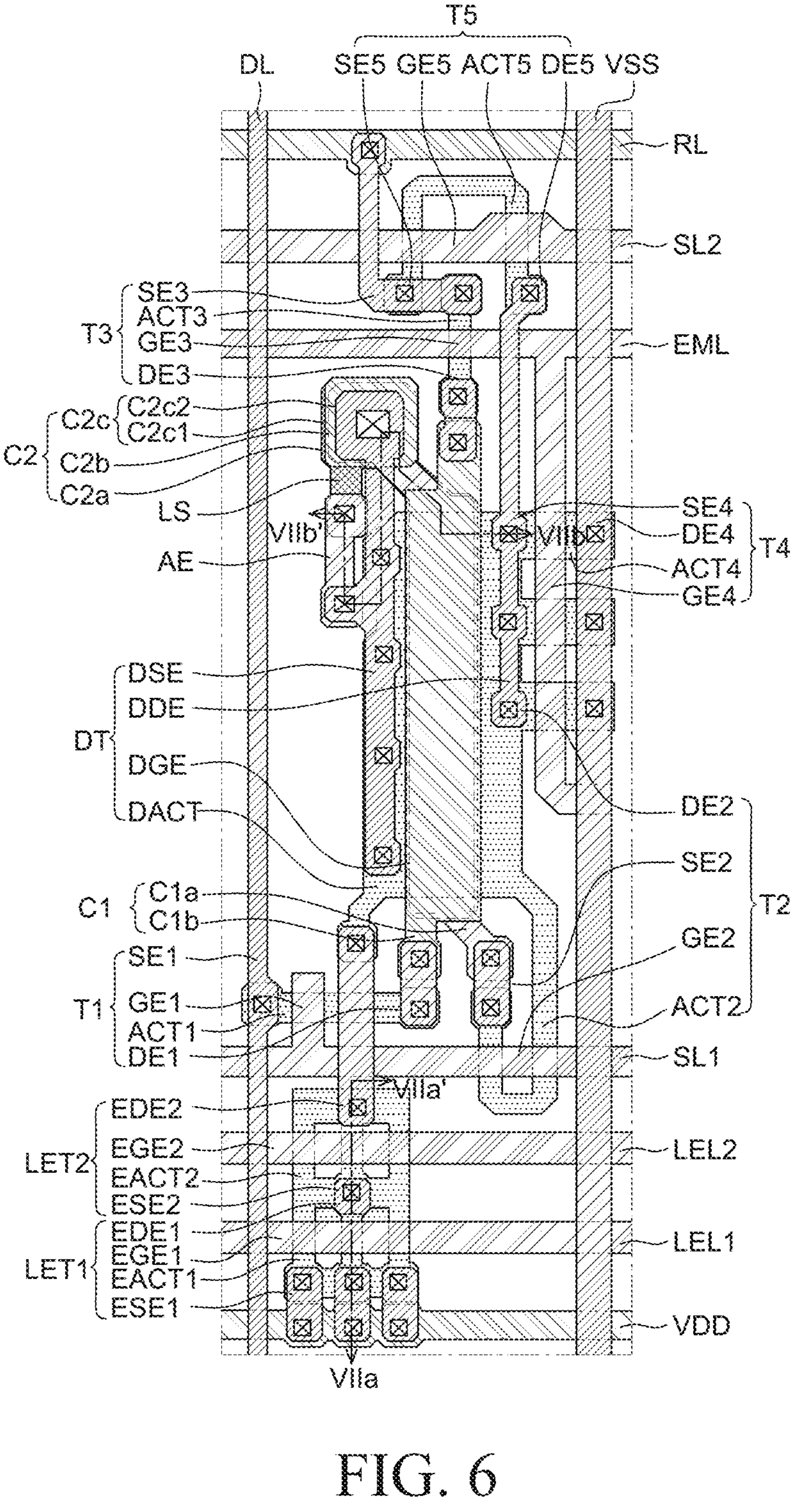
FIG. 6 is a plan view of a sub pixel of a display device according to an exemplary embodiment of the present disclosure.

FIG. 6 is a plan view of a sub pixel of a display device according to an exemplary embodiment of the present disclosure. FIG. 7 is a cross-sectional view taken along the lines VIIa-VIIa' and VIIb-VIIb' of FIG. 6 according to an exemplary embodiment of the present disclosure. For the convenience of description, in FIG. 6, a plurality of reflective electrodes RE, a first light emitting diode LED1, a second light emitting diode LED2, a plurality of connection electrodes CE, and a bank BB are not illustrated.

Figure 7:
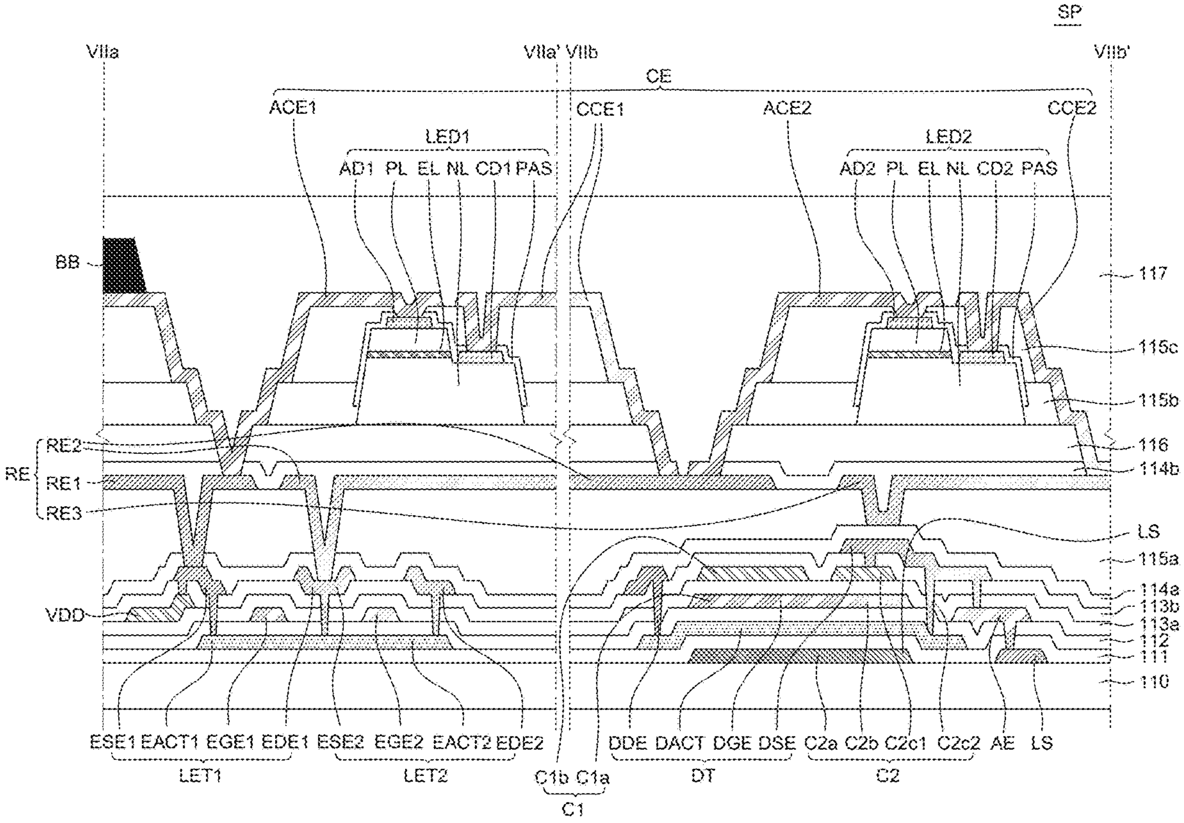
FIG. 7 is a cross-sectional view taken along the lines VIIa-VIIa' and VIIb-VIIb' of FIG. 6 according to an exemplary embodiment of the present disclosure.

Referring to FIGS. 6 and 7, the display device 100 according to the exemplary embodiment of the present disclosure includes a substrate 110, a buffer layer 111, a gate insulating layer 112, a first interlayer insulating layer 113a, a second interlayer insulating layer 113b, a first passivation layer 114a, a second passivation layer 114b, a first planarization layer 115a, a second planarization layer 115b, a third planarization layer 115c, an adhesive layer 116, a bank BB, a protection layer 117, a light shielding layer LS, a plurality of transistors, a plurality of capacitors, a plurality of wiring lines, a plurality of reflective electrodes RE, a plurality of connection electrodes CE, and a plurality of light emitting diodes LED.

First, the substrate 110 is a component for supporting various components included in the display device 100 and may be formed of an insulating material. For example, the substrate 110 may be formed of glass or resin. Further, the substrate 110 may be configured to include polymer or plastics or may be formed of a material having flexibility.

The light shielding layer LS is disposed in each of the plurality of sub pixels SP on the substrate 110. The light shielding layer LS blocks light incident onto a driving active layer DUCT of the driving transistor DT to be described below, below the substrate 110. Light which is incident onto the driving active layer DACT of the driving transistor DT is blocked by the light shielding layer LS to minimize a leakage current. The light shielding layer LS may be configured by an opaque conductive material such as copper (Cu), aluminum (Al), molybdenum (Mo), nickel (Ni), titanium (Ti), chrome (Cr), or an alloy thereof, but is not limited thereto.

The buffer layer 111 is disposed on the substrate 110 and the light shielding layer LS. The buffer layer 111 may reduce permeation of moisture or impurities through the substrate 110. The buffer layer 111 may be configured by a single layer or a double layer of silicon oxide (SiOx) or silicon nitride (SiNx), but is not limited thereto. However, the buffer layer 111 may be omitted depending on a type of substrate 110 or a type of transistor, but is not limited thereto.

The driving transistor DT is disposed on the buffer layer 111. The driving transistor DT includes a driving active layer DACT, a driving gate electrode DGE, a driving source electrode DSE, and a driving drain electrode DDE.

The driving active layer DACT is disposed on the buffer layer 111. The driving active layer DACT may be formed of a semiconductor material, such as an oxide semiconductor, amorphous silicon, or polysilicon, but is not limited thereto.

The gate insulating layer 112 is disposed on the driving active layer DACT. The gate insulating layer 112 is an insulating layer which electrically insulates the driving active layer DACT from the driving gate electrode DGE and may be configured by a single layer or a double layer of silicon oxide (SiOx) or silicon nitride (SiNx), but is not limited thereto.

The driving gate electrode DGE is disposed on the gate insulating layer 112. The driving gate electrode DGE may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer **113*a* and the second interlayer insulating layer 113*b* are disposed on the driving gate electrode DGE. In the first interlayer insulating layer 113*a* and the second interlayer insulating layer 113*b*, a contact hole through which the driving source electrode DSE and the driving drain electrode DDE are connected to the driving active layer DACT is formed. The first interlayer insulating layer 113*a* and the second interlayer insulating layer 113*b* are insulating layers which protect components below the first interlayer insulating layer 113*a* and the second interlayer insulating layer 113*b*. Further, the first interlayer insulating layer 113*a* and the second interlayer insulating layer 113*b*** may be configured by a single layer or a double layer of silicon oxide (SiOx) or silicon nitride (SiNx), but is not limited thereto.

The driving source electrode DSE and the driving drain electrode DDE which are electrically connected to the driving active layer DACT are disposed on the second interlayer insulating layer **113*b***. The driving source electrode DSE and the driving drain electrode DDE may be configured by a conductive material, such as copper (Cu), aluminum (Al), molybdenum (Mo), nickel (Ni), titanium (Ti), chrome (Cr), or an alloy thereof, but are not limited thereto.

The first transistor T1 is disposed on the buffer layer 111. The first transistor T1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto.

The gate insulating layer 112 is disposed on the first active layer ACT1 and the first gate electrode GE1 is disposed on the gate insulating layer 112. The first gate electrode GE1 is integrally formed with the first scan line SL1 to be electrically connected to the first scan line SL1. The first gate electrode GE1 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer **113*a* and the second interlayer insulating layer 113*b* are disposed on the first gate electrode GE1. Further, the first source electrode SE1 and the first drain electrode DE1 which are electrically connected to the first active layer ACT1 are disposed on the second interlayer insulating layer 113*b*. The first source electrode SE1 is integrally formed with the data line DL to be electrically connected to the data line DL. The first drain electrode DE1 may be electrically connected to a 1-2-th capacitor electrode C1*b* of the first capacitor C1 to be described below through a contact hole of the second interlayer insulating layer 113*b*. The first source electrode SE1 and the first drain electrode DE1** may be configured by a conductive material, such as copper (Cu), aluminum (Al), molybdenum (Mo), nickel (Ni), titanium (Ti), chrome (Cr), or an alloy thereof, but are not limited thereto.

The second transistor T2 is disposed on the buffer layer 111. The second transistor T2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material, such as an oxide semiconductor, amorphous silicon, or polysilicon, but is not limited thereto.

The gate insulating layer 112 is disposed on the second active layer ACT2 and the second gate electrode GE2 is disposed on the gate insulating layer 112. The second gate electrode GE2 is integrally formed with the first scan line SL1 to be electrically connected to the first scan line SL1. The second gate electrode GE2 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer **113*a* and the second interlayer insulating layer 113*b* are disposed on the second gate electrode GE2. Further, the second source electrode SE2 and the second drain electrode DE2 which are electrically connected to the second active layer ACT2 are disposed on the second interlayer insulating layer 113*b*. The second source electrode SE2 is electrically connected to the driving gate electrode DGE which is a 1-1-th capacitor electrode C1*a* of the first capacitor C1. The second drain electrode DE2** is electrically connected to the fourth source electrode SE4 of the fourth transistor T4, the fifth drain electrode DE5 of the fifth transistor T5, and the driving drain electrode DDE of the driving transistor DT. The second source electrode SE2 and the second drain electrode DE2 may be configured by a conductive material, such as copper (Cu), aluminum (Al), molybdenum (Mo), nickel (Ni), titanium (Ti), chrome (Cr), or an alloy thereof, but are not limited thereto.

The third transistor T3 is disposed on the buffer layer 111. The third transistor T3 includes a third active layer ACT3, a third gate electrode GE3, a third source electrode SE3, and a third drain electrode DE3.

The third active layer ACT3 is disposed on the buffer layer 111. The third active layer ACT3 may be formed of a semiconductor material, such as an oxide semiconductor, amorphous silicon, or polysilicon, but is not limited thereto.

The gate insulating layer 112 is disposed on the third active layer ACT3 and the third gate electrode GE3 is disposed on the gate insulating layer 112. The third gate electrode GE3 is integrally formed with the emission control line EML to be electrically connected to the emission control line EML. The third gate electrode GE3 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the third gate electrode GE3. Further, the third source electrode SE3 and the third drain electrode DE3 which are electrically connected to the third active layer ACT3 are disposed on the second interlayer insulating layer 113*b*. The third source electrode SE3 is electrically connected to the fifth source electrode SE5 and the reference line RL. Further, the third drain electrode DE3 is electrically connected to the 1-2-th capacitor electrode C1*b* of the first capacitor C1 and the first drain electrode DE1 of the first transistor T1. The third source electrode SE3 and the third drain electrode DE3 may be configured by a conductive material, such as copper (Cu), aluminum (Al), molybdenum (Mo), nickel (Ni), titanium (Ti), chrome (Cr), or an alloy thereof, but are not limited thereto.

The fourth transistor T4 is disposed on the buffer layer 111. The fourth charging transistor T4 includes a fourth active layer ACT4, a fourth gate electrode GE4, a fourth source electrode SE4, and a fourth drain electrode DE4.

The fourth active layer ACT4 is disposed on the buffer layer 111. The fourth active layer ACT4 may be formed of a semiconductor material such as an oxide semiconductor, amorphous silicon, or polysilicon, but is not limited thereto.

The gate insulating layer 112 is disposed on the fourth active layer ACT4 and the fourth gate electrode GE4 is disposed on the gate insulating layer 112. The fourth gate electrode GE4 is integrally formed with the emission control line EML to be electrically connected to the emission control line EML. The fourth gate electrode GE4 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the fourth gate electrode GE4. Further, the fourth source electrode SE4 and the fourth drain electrode DE4 which are electrically connected to a fourth active layer ACT4 are disposed on the second interlayer insulating layer 113*b*. The fourth source electrode SE4 is electrically connected to the driving drain electrode DDE of the driving transistor DT, the fifth drain electrode DE5 of the fifth transistor T5, and the second drain electrode DE2 of the second transistor T2. Further, the fourth drain electrode DE4 is electrically connected to the low potential power line VSS. At this time, the low potential power line VSS and the fourth drain electrode DE4 are integrally formed on the same layer with the same material. The fourth source electrode SE4 and the fourth drain electrode DE4 may be configured by a conductive material, such as copper (Cu), aluminum (Al), molybdenum (Mo), nickel (Ni), titanium (Ti), chrome (Cr), or an alloy thereof, but are not limited thereto.

The fifth transistor T5 is disposed on the buffer layer 111. The fifth transistor T5 includes a fifth active layer ACT5, a fifth gate electrode GE5, a fifth source electrode SE5, and a fifth drain electrode DE5.

The fifth active layer ACT5 is disposed on the buffer layer 111. The fifth active layer ACT5 may be formed of a semiconductor material such as an oxide semiconductor, amorphous silicon, or polysilicon, but is not limited thereto.

The gate insulating layer 112 is disposed on the fifth active layer ACT5 and the fifth gate electrode GE5 is disposed on the gate insulating layer 112. The fifth gate electrode GE5 may be electrically connected to the second scan line SL2. The fifth gate electrode GE5 may be integrally formed with the second scan line SL2 on the same layer with the same material. The fifth gate electrode GE5 may be configured by a conductive material such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the fifth gate electrode GE5. Further, the fifth source electrode SE5 and the fifth drain electrode DE5 which are electrically connected to the fifth active layer ACT5 are disposed on the second interlayer insulating layer 113*b*. The fifth source electrode SE5 is electrically connected to the reference line RL and the third source electrode SE3. Further, the fifth drain electrode DE5 is connected to the driving drain electrode DDE, the fourth source electrode SE4, and the second drain electrode DE2. The fifth source electrode SE5 and the fifth drain electrode DE5 may be configured by a conductive material, such as copper (Cu), aluminum (Al), molybdenum (Mo), nickel (Ni), titanium (Ti), chrome (Cr), or an alloy thereof, but are not limited thereto.

The first control transistor LET1 is disposed on the buffer layer 111. The first control transistor LET1 includes a first control active layer EACT1, a first control gate electrode EGE1, a first control source electrode ESE1, and a first control drain electrode EDE1.

The first control active layer EACT1 is disposed on the buffer layer 111. The first control active layer EACT1 may be formed of a semiconductor material such as an oxide semiconductor, amorphous silicon, or polysilicon, but is not limited thereto.

The gate insulating layer 112 is disposed on the first control active layer EACT1 and the first control gate electrode EGE1 is disposed on the gate insulating layer 112. The first control gate electrode EGE1 is integrally formed with the first control line LEL1 to be electrically connected to the first control line LEL1. The first control gate electrode EGE1 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the first control gate electrode EGE1. Further, the first control source electrode ESE1 and the first control drain electrode EDE1 which are electrically connected to the first control active layer EACT1 are disposed on the second interlayer insulating layer 113*b*. The first control source electrode ESE1 is electrically connected to the high potential power line VDD and the first control drain electrode EDE1 is electrically connected to the second control source electrode ESE2 of the second control transistor LET2. Further, the first control source electrode ESE1 and the first drain electrode DE1 may be connected to the first light emitting diode LED1 in parallel through the first reflective electrode RE1 and the second reflective electrode RE2 to be described below. The first control source electrode ESE1 and the first control drain electrode EDE1 may be configured by a conductive material, such as copper (Cu), aluminum (Al), molybdenum (Mo), nickel (Ni), titanium (Ti), chrome (Cr), or an alloy thereof, but are not limited thereto.

The second control transistor LET2 is disposed on the buffer layer 111. The second control transistor LET2 includes a second control active layer EACT2, a second control gate electrode EGE2, a second control source electrode ESE2, and a second control drain electrode EDE2.

The second control active layer EACT2 is disposed on the buffer layer 111. The second control active layer EACT2 may be formed of a semiconductor material such as an oxide semiconductor, amorphous silicon, or polysilicon, but is not limited thereto.

The gate insulating layer 112 is disposed on the second control active layer EACT2 and the second control gate electrode EGE2 is disposed on the gate insulating layer 112. The second control gate electrode EGE2 is integrally formed with the second control line LEL2 to be electrically connected to the second control line LEL2. The second control gate electrode EGE2 may be configured by a conductive material, such as copper (Cu), aluminum (Al), molybdenum (Mo), nickel (Ni), titanium (Ti), chrome (Cr), or an alloy thereof, but is not limited thereto.

The first interlayer insulating layer 113*a* and the second interlayer insulating layer 113*b* are disposed on the second control gate electrode EGE2. Further, the second control source electrode ESE2 and the second control drain electrode EDE2 which are electrically connected to the second control active layer EACT2 are disposed on the second interlayer insulating layer 113*b*. The second control source electrode ESE2 is integrally formed with the first control drain electrode EDE1 to be electrically connected to the first control drain electrode EDE1. The second control source electrode ESE2 may be electrically connected to the second anode AD2 of the second light emitting diode LED2 through the second reflective electrode RE2 to be described below. The second control drain electrode EDE2 extends to the driving active layer DACT from the second control active layer EACT2 to be connected to the driving active layer DACT. Further, the second control drain electrode EDE2 may be electrically connected to the driving source electrode DSE through the driving active layer DACT. Further, the second control drain electrode EDE2 may be electrically connected to the second cathode CD2 of the second light emitting diode LED2 through the driving source electrode DSE and a third reflective electrode RE3. Accordingly, the second control source electrode ESE2 and the second control drain electrode EDE2 are connected to the second light emitting diode LED2 in parallel through the second reflective electrode RE2 and the third reflective electrode RE3. The second control source electrode ESE2 and the second control drain electrode EDE2 may be configured by a conductive material, such as copper (Cu), aluminum (Al), molybdenum (Mo), nickel (Ni), titanium (Ti), chrome (Cr), or an alloy thereof, but are not limited thereto.

Next, the first capacitor C1 is disposed on the gate insulating layer 112. The first capacitor C1 includes a 1-1-th capacitor electrode C1*a* and a 1-2-th capacitor electrode C1*b*. The 1-1-th capacitor electrode C1*a* and the 1-2-th capacitor electrode C1*b* may be configured by a conductive material, such as copper (Cu), aluminum (Al), molybdenum (Mo), nickel (Ni), titanium (Ti), chrome (Cr), or an alloy thereof, but is not limited thereto.

The 1-1-th capacitor electrode C1*a* is disposed on the gate insulating layer 112. The 1-1-th capacitor electrode C1*a* is integrally formed with the driving gate electrode DGE. Accordingly, the 1-1-th capacitor electrode C1*a* may be electrically connected to the driving gate electrode DGE and the second source electrode SE2 connected to the driving gate electrode DGE.

The 1-2-th capacitor electrode C1*b* is disposed on the first interlayer insulating layer 113*a*. The 1-2-th capacitor electrode C1*b* is disposed to overlap the 1-1-th capacitor electrode C1*a* with the first interlayer insulating layer 113*a* therebetween. Further, the 1-2-th capacitor electrode C1*b* may be electrically connected to the first drain electrode DE1 and the third drain electrode DE3.

The second capacitor C2 is disposed on the substrate 110. The second capacitor C2 includes a 2-1-th capacitor electrode C2*a*, a 2-2-th capacitor electrode C2*b*, and a 2-3-th capacitor electrode C2*c*. The 2-1-th capacitor electrode C2*a*, the 2-2-th capacitor electrode C2*b*, and the 2-3-th capacitor electrode C2*c* may be configured by a conductive material, such as copper (Cu), aluminum (Al), molybdenum (Mo), nickel (Ni), titanium (Ti), chrome (Cr), or an alloy thereof, but is not limited thereto.

The 2-1-th capacitor electrode C2*a* is disposed on the substrate 110. The 2-1-th capacitor electrode C2*a* extends from the light shielding layer LS and is integrally formed with the light shielding layer LS. At this time, the 2-1-th capacitor electrode C2*a* may be electrically connected to the driving source electrode DSE through an auxiliary electrode AE. The auxiliary electrode AE is disposed on the gate insulating layer 112 to electrically connect the driving source electrode DSE and the 2-1-th capacitor electrode C2*a* to each other.

The 2-2-th capacitor electrode C2*b* is disposed on the buffer layer 111 and the gate insulating layer 112. The 2-2-th capacitor electrode C2*b* may be integrally formed with the driving gate electrode DGE and the 1-1-th capacitor electrode C1*a*. Accordingly, the 2-1-th capacitor electrode C2*a* may be electrically connected to the driving gate electrode DGE, the 1-1-th capacitor electrode C1*a*, and the second source electrode SE2.

The 2-3-th capacitor electrode C2*c* is disposed on the first interlayer insulating layer 113*a*. The 2-3-th capacitor electrode C2*c* may be configured by a first electrode layer C2*c*1 and a second electrode layer C2*c*2. The first electrode layer C2*c*1 of the 2-3-th capacitor electrode C2*c* is on the same layer with the same material as the 1-2-th capacitor electrode C1*b* and is spaced apart from the 1-2-th capacitor electrode C1*b* to be formed in an island shaped pattern. The first electrode layer C2*c*1 may be disposed so as to overlap the 2-1-th capacitor electrode C2*a* and the 2-2-th capacitor electrode C2*b* with the first interlayer insulating layer 113*a* therebetween.

The second electrode layer C2*c*2 of the 2-3-th capacitor electrode C2*c* is disposed on the second interlayer insulating layer 113*b*. The second electrode layer C2*c*2 may be integrally formed with the driving source electrode DSE. The second electrode layer C2c2 may be electrically connected to the first electrode layer C2c1 through a contact hole of the second interlayer insulating layer 113*b*.

Next, a plurality of wiring lines is disposed on the substrate 110. The plurality of wiring lines includes a first scan line SL1, a second scan line SL2, an emission control line EML, a first control line LEL1, a second control line LEL2, a reference line RL, a data line DL, a high potential power line VDD, and a low potential power line VSS.

First, the first scan line SL1, the second scan line SL2, the emission control line EML, the first control line LEL1, and the second control line LEL2 are disposed on the gate insulating layer 112. The first scan line SL1, the second scan line SL2, the emission control line EML, the first control line LEL1, and the second control line LEL2 extend in a row direction and may be electrically connected to other configurations of the sub pixel SP. For example, the first scan line SL1 is connected to the first transistor T1 and the second transistor T2 and the second scan line SL2 may be connected to the fifth transistor T5. The emission control line EML is connected to the third transistor T3 and the fourth transistor T4 and the first control line LEL1 and the second control line LEL2 may be connected to the first control transistor LET1 and the second control transistor LET2. The first scan line SL1, the second scan line SL2, the emission control line EML, the first control line LEL1, and the second control line LEL2 are configured by a conductive material, such as copper (Cu), aluminum (Al), molybdenum (Mo), nickel (Ni), titanium (Ti), and chrome (Cr), or an alloy thereof, but are not limited thereto.

Next, the reference line RL and the high potential power line VDD are disposed on the first interlayer insulting layer 113*a*. The reference line RL and the high potential power line VDD extend in the row direction and may be electrically connected to the other configurations of the sub pixel SP. For example, the reference line RL is connected to the fifth transistor T5 and the high potential power line VDD may be connected to the first control transistor LET1. The reference line RL and the high potential power line VDD may be configured by a conductive material such as copper (Cu), aluminum (Al), molybdenum (Mo), nickel (Ni), titanium (Ti), chrome (Cr), or an alloy thereof, but are not limited thereto.

The data line DL and the low potential power line VSS are disposed on the second interlayer insulating layer 113*b*. The data line DL and the low potential power line VSS extend in the column direction and may intersect other wiring lines extending in the row direction. Further, the data line DL and the low potential power line VSS may be electrically connected to the other configurations of the sub pixel SP. For example, the data line DL is connected to the first transistor T1 and the low potential power line VSS may be connected to the fourth transistor T4. The data line DL and the low potential power line VSS may be configured by a conductive material such as copper (Cu), aluminum (Al), molybdenum (Mo), nickel (Ni), titanium (Ti), chrome (Cr), or an alloy thereof, but are not limited thereto.

Next, a first passivation layer 114*a* is disposed on the driving transistor DT, the first transistor T1, the second transistor T2, the third transistor T3, the fourth transistor T4, the fifth transistor T5, the first control transistor LET1, the second control transistor LET2, the first capacitor C1, and the second capacitor C2. The first passivation layer 114*a* is an insulating layer which protects components below the first passivation layer 114*a* and may be configured by an inorganic material, such as silicon oxide SiOx or silicon nitride SiNx, but is not limited thereto.

A first planarization layer 115*a* is disposed on the first passivation layer 114*a*. The first planarization layer 115*a* may planarize an upper portion of the substrate 110 including the driving transistor DT. The first planarization layer 115*a* may be configured by a single layer or a double layer, and for example, configured by photoresist, benzocyclobutene or an acrylic-based organic material, but is not limited thereto.

A plurality of reflective electrodes RE are disposed on the first planarization layer 115*a*. The plurality of reflective electrodes RE reflect light emitted from the plurality of light emitting diodes LED above the substrate 110 and may be disposed so as to cover the most area of the plurality of sub pixels SP. Further, the plurality of reflective electrodes RE reflect the light emitted from the light emitting diode LED and may be also used as an electrode which electrically connects the plurality of light emitting diodes LED and the other configuration of the sub pixel SP. The plurality of reflective electrodes RE may include various conductive layers in consideration of a light reflection efficiency and a resistance. For example, the reflective electrodes RE may be formed of an opaque conductive layer having a high reflectance, such as silver (Ag), aluminum (Al), molybdenum (Mo), titanium (Ti), or an alloy thereof. Further, the reflective electrode RE may further include a transparent conductive layer, such as indium tin oxide (ITO), to improve the resistance.

The plurality of reflective electrodes RE include a first reflective electrode RE1, a second reflective electrode RE2, and a third reflective electrode RE3.

The first reflective electrode RE1 is an electrode which electrically connects the first control source electrode ESE1 and the first light emitting diode LED1. The first reflective electrode RE1 may be electrically connected to the first control source electrode ESE1 through a contact hole formed in the first planarization layer 115*a* and the first passivation layer 114*a*. The first reflective electrode RE1 may be electrically connected to the first anode AD1 of the first light emitting diode LED1 through a first anode AD1 connection electrode CE to be described below. Accordingly, the first control source electrode ESE1 of the first control transistor LET1 and the first anode AD1 of the first light emitting diode LED1 may be electrically connected to each other through the first reflective electrode RE1.

The second reflective electrode RE2 is an electrode which electrically connects the first control drain electrode EDE1 and the first light emitting diode LED1 and electrically connects the second control source electrode ESE2 and the second light emitting diode LED2, simultaneously. The second reflective electrode RE2 may be electrically connected to the first control drain electrode EDE1 and the second control source electrode ESE2 through a contact hole formed in the first planarization layer 115*a* and the first passivation layer 114*a*. The second reflective electrode RE2 may be electrically connected to the first cathode CD1 of the first light emitting diode LED1 through a first cathode CD1 connection electrode CE to be described below. Further, the second reflective electrode RE2 may be electrically connected to the second anode AD2 of the second light emitting diode LED2 through a second anode AD2 connection electrode CE to be described below. Accordingly, the first control drain electrode EDE1 of the first control transistor LET1 and the first cathode CD1 of the first light emitting diode LED1 may be electrically connected to each other through the second reflective electrode RE2. Further, the second control source electrode ESE2 of the second control transistor LET2 and the second anode AD2 of the second light emitting diode LED2 may be electrically connected to each other through the second reflective electrode RE2.

The third reflective electrode RE3 is an electrode which electrically connects the second light emitting diode LED2, the driving source electrode DSE, and the second control drain electrode EDE2. The third reflective electrode RE3 may be electrically connected to the driving source electrode DSE through a contact hole formed in the first planarization layer 115*a* and the first passivation layer 114*a*. At this time, the driving source electrode DSE and the second control drain electrode EDE2 of the second control transistor LET2 are electrically connected to each other through the driving active layer DACT. Therefore, the third reflective electrode RE3 may be also electrically connected to the second control drain electrode EDE2. Further, the third reflective electrode RE3 may be electrically connected to the second cathode CD2 of the second light emitting diode LED2 through a second cathode CD2 connection electrode CE to be described below. Accordingly, the second control drain electrode EDE2 and the driving source electrode DSE, and the second cathode CD2 of the second light emitting diode LED2 may be electrically connected to each other through the third reflective electrode RE3.

Next, a second passivation layer 114*b* is disposed on the plurality of reflective electrodes RE. The second passivation layer 114*b* is an insulating layer which protects components below the second passivation layer 114*b* and may be configured by a single layer or a double layer of silicon oxide SiOx or silicon nitride SiNx, but is not limited thereto.

The adhesive layer 116 is disposed on the second passivation layer 114*b*. The adhesive layer 116 is formed on the front surface of the substrate 110 to fix the plurality of light emitting diodes LED disposed on the adhesive layer 116. The adhesive layer 116 may be formed of a photo curable adhesive material which is cured by light. For example, the adhesive layer 116 may be formed of an acrylic-based material including a photoresist, but is not limited thereto.

The plurality of light emitting diodes LED are disposed on the adhesive layer 116. Each of the plurality of light emitting diodes LED is an element which emits light by a current and for example, may be a light emitting diode (LED) or a micro LED. The plurality of light emitting diodes LED include a red light emitting diode LED which emits red light, a green light emitting diode LED which emits green light, and a blue light emitting diode LED which emits blue light and implements light with various colors including white by a combination thereof. The first light emitting diode LED1 and the second light emitting diode LED2 which are disposed on the same sub pixel SP to be connected in series may be light emitting diodes which emit light with the same color.

The first light emitting diode LED1 and the second light emitting diode LED2 may be formed with the substantially same structure. A first semiconductor layer NL, an emission layer EL, a second semiconductor layer PL, a first anode AD1, a first cathode CD1, and an encapsulation film PAS of the first light emitting diode LED1 may have the substantially same configuration as a first semiconductor layer NL, an emission layer EL, a second semiconductor layer PL, a second anode AD2, a second cathode CD2, and an encapsulation film PAS of the second light emitting diode LED2.

First, the first light emitting diode LED1 includes the first semiconductor layer NL, the emission layer EL, the second semiconductor layer PL, the first anode AD1, the first cathode CD1, and the encapsulation film PAS.

The first semiconductor layer NL is disposed on the adhesive layer 116 and the second semiconductor layer PL is disposed on the first semiconductor layer NL. The first semiconductor layer NL and the second semiconductor layer PL may be layers formed by doping n-type and p-type impurities into a specific material. For example, the first semiconductor layer NL and the second semiconductor layer PL may be layers doped with n-type and p-type impurities into a material such as gallium nitride (GaN), indium aluminum phosphide (InAlP), or gallium arsenide (GaAs). The p-type impurity may be magnesium (Mg), zinc (Zn), beryllium (Be), etc. and the n-type impurity may be silicon (Si), germanium, tin (Sn), etc., but are not limited thereto.

The emission layer EL is disposed between the first semiconductor layer NL and the second semiconductor layer PL. The emission layer EL is supplied with holes and electrons from the first semiconductor layer NL and the second semiconductor layer PL to emit light. The emission layer EL may be formed by a single layer or a multi-quantum well (MQW) structure, and for example, may be formed of indium gallium nitride (InGaN) or gallium nitride (GaN), but is not limited thereto.

The first cathode CD1 is disposed on the first semiconductor layer NL. The first cathode CD1 may be disposed on a top surface of the first semiconductor layer NL which is exposed from the emission layer EL and the second semiconductor layer PL. In this case, the first semiconductor layer NL which is electrically connected to the first cathode CD1 may be a semiconductor layer which is doped with the n-type impurity. The first cathode CD1 may be electrically connected to the second anode AD2 of the second light emitting diode LED2, the first control drain electrode EDE1 of the first control transistor LET1, and the second control source electrode ESE2 of the second control transistor LET2 through the first cathode CD1 connection electrode CE and the second reflective electrode RE2. The first cathode CD1 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The first anode AD1 is disposed on the second semiconductor layer PL. The first anode AD1 may be disposed on a top surface of the second semiconductor layer PL. The second semiconductor layer PL which is electrically connected to the first anode AD1 is a semiconductor layer doped with a p-type impurity. The first anode AD1 may be electrically connected to the high potential power line VDD and the first control source electrode ESE1 of the first control transistor LET1 through the first anode AD1 connection electrode CE and the first reflective electrode RE1. The first anode AD1 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

Next, the encapsulation film PAS which encloses the first semiconductor layer NL, the emission layer EL, the second semiconductor layer PL, the first anode AD1, and the first cathode CD1 is disposed. The encapsulation film PAS is formed of an insulating material to protect the first semiconductor layer NL, the emission layer EL, and the second semiconductor layer PL. Further, a contact hole through which the first anode AD1 and the first cathode CD1 are exposed is formed in the encapsulation film PAS so that the first anode AD1 and the first cathode CD1 may be electrically connected to the first anode AD1 connection electrode CE and the first cathode CD1 connection electrode CE.

In the meantime, a part of the side surface of the first semiconductor layer NL may be exposed from the encapsulation film PAS. The light emitting diode LED manufactured on the wafer is separated from the wafer to be transferred onto the display panel PN. However, during the process of separating the light emitting diode LED from the wafer, a part of the encapsulation film PAS may be torn. For example, a part of the encapsulation layer PAS which is adjacent to a lower edge of the first semiconductor layer NL of the light emitting diode LED is torn during the process of separating the light emitting diode LED from the wafer. Accordingly, a part of a lower side surface of the first semiconductor layer NL may be exposed to the outside. However, even though the lower portion of the light emitting diode LED is exposed from the encapsulation film PAS, the first anode AD1 connection electrode CE and the first cathode CD1 connection electrode CE are formed after forming the second planarization layer 115*b* and the third planarization layer 115*c* which cover the side surface of the first semiconductor layer NL. Accordingly, a short defect may be reduced.

Next, the second light emitting diode LED2 includes the first semiconductor layer NL, the emission layer EL, the second semiconductor layer PL, the second anode AD2, the second cathode CD2, and the encapsulation film PAS. The first semiconductor layer NL, the emission layer EL, the second semiconductor layer PL, and the encapsulation film PAS of the second light emitting diode LED2 are formed with the substantially same structure and material as the first semiconductor layer NL, the emission layer EL, the second semiconductor layer PL, and the encapsulation film PAS of the first light emitting diode LED1.

Further, like the first cathode CD1 of the first light emitting diode LED1, the second cathode CD2 of the second light emitting diode LED2 is disposed on the first semiconductor layer NL and may be configured by a transparent conductive material, such as indium tin oxide (ITO) or indium zinc oxide (IZO), or an opaque conductive material, such as titanium (Ti), gold (Au), silver (Ag), copper (Cu), or an alloy thereof. Further, the second cathode CD2 may be electrically connected to the driving source electrode DSE of the driving transistor DT and the second control drain electrode EDE2 of the second control transistor LET2 through the second cathode CD2 connection electrode CE and the third reflective electrode RE3.

Like the first anode AD1 of the first light emitting diode LED1, the second anode AD2 of the second light emitting diode LED2 is disposed on the second semiconductor layer PL and may be configured by a transparent conductive material, such as indium tin oxide (ITO) or indium zinc oxide (IZO), or an opaque conductive material, such as titanium (Ti), gold (Au), silver (Ag), copper (Cu), or an alloy thereof. The second anode AD2 may be electrically connected to the first cathode CD1 of the first light emitting diode LED1, the first control drain electrode EDE1 of the first control transistor LET1, and the second control source electrode ESE2 of the second control transistor LET2 through the second anode AD2 connection electrode CE and the second reflective electrode RE2.

Next, the second planarization layer 115*b* and the third planarization layer 115*c* are disposed on the adhesive layer 116 and the light emitting diode LED.

The second planarization layer 115*b* overlaps a part of side surfaces of the plurality of light emitting diodes LED to fix and protect the plurality of light emitting diodes LED. A torn part of the encapsulation film PAS which protects the side surface of the first semiconductor layer NL of the light emitting diode LED may be covered by the second planarization layer 115*b*. By doing this, contacts and short defects of the connection electrode CE and the first semiconductor layer NL thereafter may be suppressed.

The third planarization layer 115*c* is formed to cover upper portions of the second planarization layer 115*b* and the light emitting diode LED. A contact hole through which the first anode AD1 and the first cathode CD1 of the first light emitting diode LED1 and the second anode AD2 and the second cathode CD2 of the second light emitting diode LED2 are exposed may be formed in the third planarization layer 115*c*. The first anode AD1, the first cathode CD1, the second anode AD2, and the second cathode CD2 are exposed from the third planarization layer 115*c*. However, the third planarization layer 115*c* is partially disposed in an area between the first anode AD1 and the first cathode CD1 of the first light emitting diode LED1 and an area between the second anode AD2 and the second cathode CD2 of the second light emitting diode LED2 to reduce the short defect. The second planarization layer 115*b* and the third planarization layer 115*c* may be configured by a single layer or a double layer, and for example, configured by photoresist, benzocyclobutene or an acrylic-based organic material, but are not limited thereto.

A plurality of connection electrodes CE are disposed on the third planarization layer 115*c*. The plurality of connection electrodes CE are electrodes which electrically connect the plurality of light emitting diodes LED and the other configurations of the sub pixel SP. The plurality of connection electrodes CE include the first cathode CD1 connection electrode CE, the first anode AD1 connection electrode CE, the second cathode CD2 connection electrode CE, and the second anode AD2 connection electrode CE. The plurality of connection electrodes CE are formed of a transparent conductive material, such as indium tin oxide (ITO) or indium zinc oxide (IZO), but is not limited thereto.

First, the first cathode CD1 connection electrode CE may be electrically connected to the second reflective electrode RE2 through a contact hole formed in the third planarization layer 115*c*, the second planarization layer 115*b*, and the second passivation layer 114*b*. Further, the first cathode CD1 connection electrode CE may be electrically connected to the first cathode CD1 of the first light emitting diode LED1 through a contact hole of the third planarization layer 115*c*. Accordingly, the first cathode CD1 and the second reflective electrode RE2 may be electrically connected through the first cathode CD1 connection electrode CE.

The first anode AD1 connection electrode CE may be electrically connected to the first reflective electrode RE1 through a contact hole formed in the third planarization layer 115*c*, the second planarization layer 115*b*, and the second passivation layer 114*b*. The first anode AD1 connection electrode CE may be electrically connected to the first anode AD1 of the first light emitting diode LED1 through a contact hole of the third planarization layer 115*c*. Accordingly, the first anode AD1 and the first reflective electrode RE1 may be electrically connected through the first anode AD1 connection electrode CE.

The second cathode CD2 connection electrode CE may be electrically connected to the third reflective electrode RE3 through a contact hole formed in the third planarization layer 115*c*, the second planarization layer 115*b*, and the second passivation layer 114*b*. Further, the second cathode CD2 connection electrode CE may be electrically connected to the second cathode CD2 of the second light emitting diode LED2 through a contact hole of the third planarization layer 115*c*. Accordingly, the second cathode CD2 and the third reflective electrode RE3 may be electrically connected through the second cathode CD2 connection electrode CE.

The second anode AD2 connection electrode CE may be electrically connected to the second reflective electrode RE2 through a contact hole formed in the third planarization layer 115*c*, the second planarization layer 115*b*, and the second passivation layer 114*b*. The second anode AD2 connection electrode CE may be electrically connected to the second anode AD2 of the second light emitting diode LED2 through a contact hole of the third planarization layer 115*c*. Accordingly, the second anode AD2 and the second reflective electrode RE2 may be electrically connected through the second anode AD2 connection electrode CE.

In the meantime, both the first cathode CD1 connection electrode CE and the second anode AD2 connection electrode CE may be connected to the second reflective electrode RE2. Even though in the drawing, it is illustrated that the first cathode CD1 connection electrode CE and the second anode AD2 connection electrode CE are spaced apart from each other on the second reflective electrode RE2, the first cathode CD1 connection electrode CE and the second anode AD2 connection electrode CE are connected to be integrally formed, but are not limited thereto.

Next, a bank BB is disposed on the second planarization layer 115*b*. The bank BB is disposed to be spaced apart from the light emitting diode LED with a predetermined interval and at least partially overlaps the plurality of reflective electrodes RE. Further, the bank BB may be disposed so as to cover at least a part of the plurality of connection electrodes CE. The bank BB may be formed of an opaque material to reduce color mixture between the plurality of sub pixels SP and for example, may be formed of black resin, but is not limited thereto.

The protection layer 117 is disposed on the plurality of connection electrodes CE and the bank BB. The protection layer 117 is a layer for protecting configurations below the protection layer 117. The protection layer 117 may be configured by a single layer or a double layer, and for example, configured by benzocyclobutene, a light-transmitting epoxy, a photoresist, or an acrylic-based organic material, but is not limited thereto.

In the meantime, the display device 100 according to the exemplary embodiment of the present disclosure includes a gate driver GD and a data driver DD as described above to drive the plurality of sub pixels SP of the display panel PN. At this time, the gate driver GD generates a first scan signal SCAN1, a second scan signal SCAN2, and an emission control signal EM to apply the signals to the first scan line SL1, the second scan line SL2, and the emission control line EML. Further, the gate driver GD further generates a first control signal LE1 and a second control signal LE2 to apply the signals to the first control line LEL1 and the second control line LEL2. Specifically, any one of the first control signal LE1 and the second control signal LE2 has the same waveform as the first scan signal SCAN1 so that the first scan signal SCAN1 generated in the gate driver GD may be utilized for any one of the first control signal LE1 and the second control signal LE2. Accordingly, the display device 100 according to the exemplary embodiment of the present disclosure further includes a control signal generating circuit LEC which additionally generates the first control signal LE1 and the second control signal LE2 to the gate driver GD including a plurality of first stages ST1 which generates the first scan signal SCAN1.

Hereinafter, the control signal generating circuit LEC will be described in detail with reference to FIGS. 8 and 9.

Figure 8:
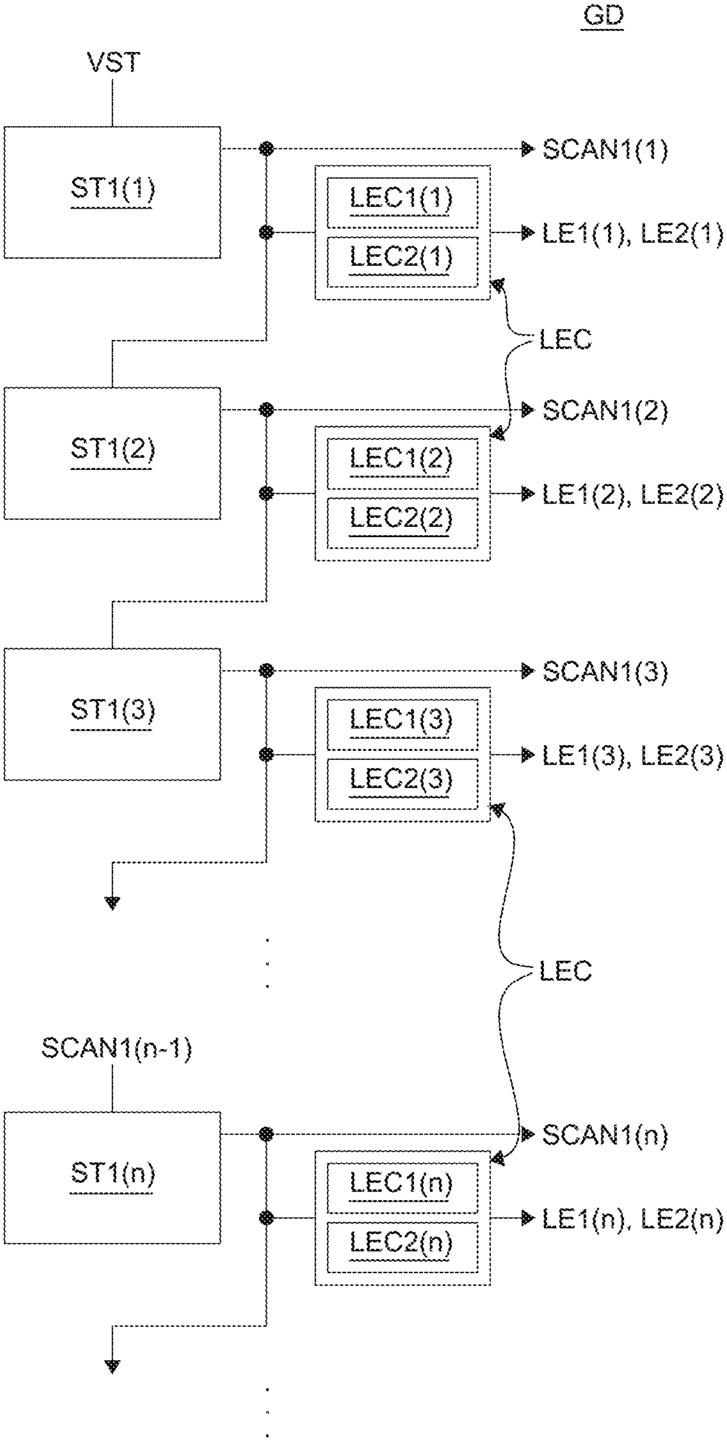
FIG. 8 is a diagram of a gate driver of a display device according to an exemplary embodiment of the present disclosure.

FIG. 8 is a diagram of a gate driver of a display device according to an exemplary embodiment of the present disclosure. FIG. 9 is a circuit diagram of a control signal generating circuit of a display device according to an exemplary embodiment of the present disclosure. FIG. 10 is a driving timing diagram of a control signal generating circuit of a display device according to an exemplary embodiment of the present disclosure.

First, the gate driver GD includes a plurality of first stages ST1 to generate a first scan signal SCAN1. The plurality of first stages ST1 are dependently connected and may generate the first scan signal SCAN1 based on a start signal VST or a first scan signal SCAN1 output from a first stage ST1 of a previous stage. For example, the first stage ST1 at the top receives the start signal VST to output the first scan signal SCAN1 to a first scan line SL1 at the top. An n-th first stage ST1 receives a first scan signal SCAN1 from an n−1-th first stage ST1 of a previous stage to output the first scan signal SCAN1 to the n-th first scan line SL1.

Further, the control signal generating circuit LEC is connected to an output terminal of each of the plurality of first stages ST1. The control signal generating circuit LEC includes a first circuit LEC1 and a second circuit LEC2 and each of the first circuit LEC1 and the second circuit LEC2 receives the first scan signal SCAN1 output from the first stage ST1 to generate a first control signal LE1 and a second control signal LE2.

Figure 9:
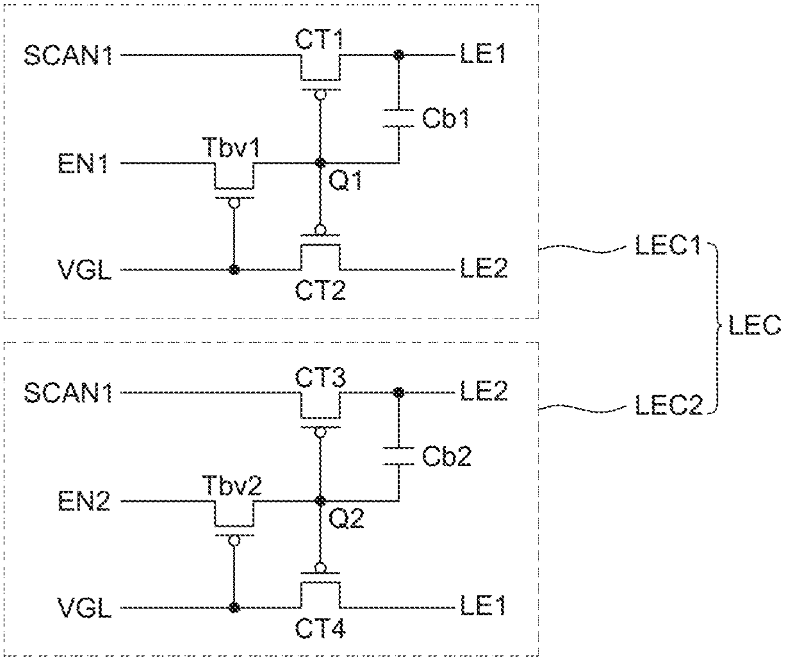
FIG. 9 is a circuit diagram of a control signal generating circuit of a display device according to an exemplary embodiment of the present disclosure.
Figure 10:
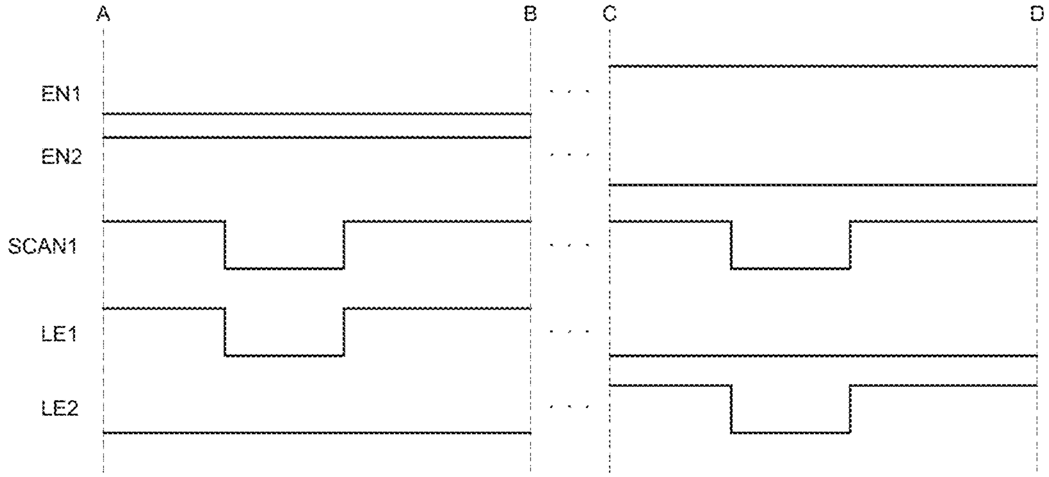
FIG. 10 is a driving timing diagram of a control signal generating circuit of a display device according to an exemplary embodiment of the present disclosure.

Referring to FIG. 9, the first circuit LEC1 is a circuit which generates the first control signal LE1 and the second control signal LE2 when the first light emitting diode LED1 emits light. The first circuit LEC1 may generate a first control signal LE1 having the same waveform as the first scan signal SCAN1 and a turn-on level of second control signal LE2. The first circuit LEC1 includes a first connection transistor CT1, a second connection transistor CT2, a first auxiliary transistor Tbv1, and a first boosting capacitor Cb1.

First, the first connection transistor CT1 is a transistor which selectively connects an output terminal of the first stage ST1 and a first control line LEL1. A gate electrode of the first connection transistor CT1 is connected to a drain electrode of the first auxiliary transistor Tbv1 and a Q1 node Q1, a source electrode is connected to an output terminal of the first stage ST1, and a drain electrode may be connected to the first control line LEL1. The first connection transistor CT1 may be turned on or turned off based on a first enable signal EN1 transmitted through the first auxiliary transistor Tbv1. The turned-on first connection transistor CT1 may connect an output terminal of the first stage ST1 and the first control line LEL1 and the first scan signal SCAN1 from the first stage ST1 may be transmitted to the first control line LEL1 through the first connection transistor CT1. Therefore, the first scan signal SCAN1 is transmitted to the first control line LEL1 as it is so that the first scan signal SCAN1 and the first control signal LE1 may have the same waveform.

The second connection transistor CT2 is a transistor which selectively connects a gate low line and the second control line LEL2. A gate electrode of the second connection transistor CT2 is connected to a drain electrode of the first auxiliary transistor Tbv1 and a Q1 node Q1, a source electrode is connected to a gate low line, and a drain electrode may be connected to the second control line LEL2. The second connection transistor CT2 may be turned on or turned off based on a first enable signal EN1 transmitted through the first auxiliary transistor Tbv1. The turned-on second connection transistor CT2 may connect the gate low line and the second control line LEL2 and a gate low voltage VGL of the gate low line may be transmitted to the second control line LEL2 through the second connection transistor CT2. Accordingly, the gate low voltage VGL serves as a low level of second control signal LE2 to be output to the second control line LEL2.

The first auxiliary transistor Tbv1 is connected between the first enable line and the Q1 node Q1. A gate electrode of the first auxiliary transistor Tbv1 is connected to the gate low line, a source electrode is connected to a first enable line, and a drain electrode is connected to the Q1 node Q1. The first auxiliary transistor Tbv1 whose gate electrode is connected to the gate low line is always turned on and may electrically connect the first enable line and the Q1 node Q1.

The first boosting capacitor Cb1 is connected between the Q1 node Q1 and the first control line LEL1. A voltage of the Q1 node Q1 may be instantaneously lower than the first enable voltage and the first connection transistor CT1 stably maintains a turned-on state by bootstrapping of the first boosting capacitor Cb1. Accordingly, the first boosting capacitor Cb1 may assist the first scan signal SCAN1 to be output as the first control signal LE1 without distortion and delay.

Next, the second circuit LEC2 is a circuit which generates the first control signal LE1 and the second control signal LE2 when the second light emitting diode LED2 emits light. The second circuit LEC2 may generate a turn-on level of first control signal LE1 and a second control signal LE2 having the same waveform as the first scan signal SCAN1. The second circuit LEC2 includes a third connection transistor CT3, a fourth connection transistor CT4, a second auxiliary transistor Tbv2, and a second boosting capacitor Cb2.

The third connection transistor CT3 is a transistor which selectively connects the output terminal of the first stage ST1 and the second control line LEL2. A gate electrode of the third connection transistor CT3 is connected to a drain electrode of the second auxiliary transistor Tbv2 and a Q2 node Q2, a source electrode is connected to an output terminal of the first stage ST1, and a drain electrode may be connected to the second control line LEL2. The third connection transistor CT3 may be turned on or turned off based on a second enable signal EN2 transmitted through the second auxiliary transistor Tbv2. The turned-on third connection transistor CT3 may connect an output terminal of the first stage ST1 and the second control line LEL2 and the first scan signal SCAN1 from the first stage ST1 may be transmitted to the second control line LEL2 through the third connection transistor CT3. Therefore, the first scan signal SCAN1 is transmitted to the second control line LEL2 as it is so that the first scan signal SCAN1 and the second control signal LE2 may have the same waveform.

The fourth connection transistor CT4 is a transistor which selectively connects the gate low line and the first control line LEL1. A gate electrode of the fourth connection transistor CT4 is connected to a drain electrode of the second auxiliary transistor Tbv2 and a Q2 node Q2, a source electrode is connected to the gate low line, and a drain electrode may be connected to the first control line LEL1. The fourth connection transistor CT4 may be turned on or turned off based on a second enable signal EN2 transmitted through the second auxiliary transistor Tbv2. The turned-on fourth connection transistor CT4 may connect the gate low line and the first control line LEL1 and a gate low voltage VGL of the gate low line may be transmitted to the first control line LEL1 through the fourth connection transistor CT4. Accordingly, the gate low voltage VGL serves as a low level of first control signal LE1 to be output to the first control line LEL1.

The second auxiliary transistor Tbv2 is connected between the second enable line and the Q2 node Q2. A gate electrode of the second auxiliary transistor Tbv2 is connected to the gate low line, a source electrode is connected to the second enable line, and a drain electrode is connected to the Q2 node Q2. The second auxiliary transistor Tbv2 whose gate electrode is connected to the gate low line is always turned on and may electrically connect the second enable line and the Q2 node Q2.

The second boosting capacitor Cb2 is connected between the Q2 node Q2 and the second control line LEL2. A voltage of the Q2 node Q2 may be lower than the second enable voltage and the third connection transistor CT3 stably maintains a turned-on state by bootstrapping of the second boosting capacitor Cb2. Accordingly, the second boosting capacitor Cb2 may assist the first scan signal SCAN1 to be output as the second control signal LE2 without distortion and delay.

Next, referring to FIGS. 9 and 10 together, a period between the time A and the time B is a period when the first light emitting diode LED1 is driven and a period between the time C and the time D is a period when the second light emitting diode LED2 is driven.

First, in the period between the time A and the time B, the first circuit LEC1 may generate and output the first control signal LE1 and the second control signal LE2 to allow only the first light emitting diode LED1 to emit light.

In the period between the time A and the time B, a low level of first enable signal EN1 is output to the first enable line and a high level of second enable signal EN2 is output to the second enable line. At this time, the first enable signal EN1 and the second enable signal EN2 are signals with reversed phases. For example, when the first enable signal EN1 is a high level, the second enable signal EN2 may be a low level and when the first enable signal EN1 is a low level, the second enable signal EN2 may be a high level. Accordingly, a turn-on period of the first connection transistor CT1 and the second connection transistor CT2 in which the first enable signal EN1 is applied to the gate electrodes and a turn-on period of the third connection transistor CT3 and the fourth connection transistor CT4 in which the second enable signal EN2 is applied to the gate electrodes may be configured by turns.

Further, in the first circuit LEC1, a low level of first enable signal EN1 may be applied to the Q1 node Q1 through the first auxiliary transistor Tbv1. The first connection transistor CT1 and the second connection transistor CT2 may be turned on by the low level of first enable signal EN1 which is applied to the Q1 node Q1. The turned-on first connection transistor CT1 may connect an output terminal of the first stage ST1 and the first control line LEL1 and the first control signal LE1 having the same waveform as the first scan signal SCAN1 may be output to the first control line LEL1. The turned-on second connection transistor CT2 may connect the gate low line and the second control line LEL2 and output a low level of second control signal LE2 which is the same voltage as the gate low voltage VGL. Accordingly, the first control signal LE1 having the same waveform as the first scan signal SCAN1 is output to the first control line LEL1 and a low level of second control signal LE2 may be output to the second control line LEL2. Therefore, during a period when the first light emitting diode LED1 emits light, the second control transistor LET2 maintains a turn-on stage so that the second light emitting diode LED2 does not emit light.

Further, in the period between the time A and the time B, a high level of second enable signal EN2 which is output to the second enable line may be transmitted to the Q2 node Q2 of the second circuit LEC2. Therefore, the third connection transistor CT3 and the fourth connection transistor CT4 of the second circuit LEC2 may be turned off by the high level of second enable signal EN2. Also, the first scan signal SCAN1 is not output to the second control line LEL2 or the gate low voltage VGL is not output to the first control line LEL1.

Next, in the period between the time C and the time D, a high level of first enable signal EN1 is output to the first enable line and a low level of second enable signal EN2 is output to the second enable line.

In the first circuit LEC1, a high level of first enable signal EN1 may be applied to the Q1 node Q1 through the first auxiliary transistor Tbv1. The first connection transistor CT1 and the second connection transistor CT2 may be turned off by the high level of first enable signal EN1 which is applied to the Q1 node Q1. Accordingly, a signal may not be output from the first circuit LEC1 to the first control line LEL1 and the second control line LEL2.

In the second circuit LEC2, a low level of second enable signal EN2 may be applied to the Q2 node Q2 through the second auxiliary transistor Tbv2. The third connection transistor CT3 and the fourth connection transistor CT4 may be turned on by the low level of second enable signal EN2 which is applied to the Q2 node Q2. The turned-on third connection transistor CT3 may connect an output terminal of the first stage ST1 and the second control line LEL2, and the second control signal LE2 having the same waveform as the first scan signal SCAN1 may be output to the second control line LEL2. The turned-on fourth connection transistor CT4 may connect the gate low line and the first control line LEL1 and output a low level of first control signal LE1 which is the same voltage as the gate low voltage VGL. Accordingly, a low level of first control signal LE1 is output to the first control line LEL1, and the second control signal LE2 having the same waveform as the first scan signal SCAN1 may be output to the second control line LEL2. Therefore, during a period when the second light emitting diode LED2 emits light, the first control transistor LET1 maintains a turn-on stage so that the first light emitting diode LED1 does not emit light.

Accordingly, in the display device 100 according to the exemplary embodiment of the present disclosure, the control signal generating circuit LEC is connected to output terminals of the plurality of first stages ST1 of the gate driver GD to easily generate the first control signal LE1 and the second control signal LE2. First, the control signal generating circuit LEC includes a first circuit LEC1 and a second circuit LEC2. When the first light emitting diode LED1 emits light, the first circuit LEC1 generates the first control signal LE1 with the same waveform as the first scan signal SCAN1 to apply the first control signal to the first control line LEL1. When the first light emitting diode LED1 emits light, the first circuit LEC1 generates a turn-on level of second control signal LE2 which turns on the second control transistor LET2 so as not to allow the second light emitting diode LED2 to emit light to apply the turn-on level of second control signal to the second control line LEL2. For example, the first circuit LEC1 outputs the first scan signal SCAN1 which receives from the first stage ST1 to the first control line LEL1 as a first control signal LE1 and may output a low level of second control signal LE2 to the second control line LEL2. Accordingly, in a frame or a horizontal period when the first light emitting diode LED1 emits light, the first control signal LE1 and the second control signal LE2 may be generated using the first circuit LEC1.

Further, when the second light emitting diode LED2 emits light, the second circuit LEC2 generates a turn-on level of first control signal LE1 which turns on the first control transistor LET1 so as not to allow the first light emitting diode LED1 to emit light to apply the turn-on level of first control signal to the first control line LEL1. When the second light emitting diode LED2 emits light, the second circuit LEC2 generates the second control signal LE2 with the same waveform as the first scan signal SCAN1 to apply the second control signal to the second control line LEL2. For example, the second circuit LEC2 outputs the first scan signal SCAN1 which receives from the first stage ST1 to the second control line LEL2 as a second control signal LE1 and may output a low level of first control signal LE1 to the first control line LEL1. Accordingly, in a frame or a horizontal period when the second light emitting diode LED2 emits light, the first control signal LE1 and the second control signal LE2 may be generated using the second circuit LEC2. Therefore, the existing first scan signal SCAN1 and gate low voltage VGL are used as it is as the first control signal LE1 and the second control signal LE2 so that the structure of the gate driver GD may be simplified.

The exemplary embodiments of the present disclosure can also be described as follows:

According to an aspect of the present disclosure, a display device includes a display panel in which a plurality of sub pixels is defined, a first light emitting diode which is disposed in each of the plurality of sub pixels, a second light emitting diode which is connected to the first light emitting diode in series, a first control transistor which is connected to the first light emitting diode in parallel and is turned on by a first control signal, and a second control transistor which is connected to the second light emitting diode in parallel and is turned on by a second control signal.

The first light emitting diode and the second light emitting diode may emit light by turns.

While the first light emitting diode emits light, the first control transistor may be turned off and the second control transistor is turned on.

While the first light emitting diode emits light, a driving current may flow from the first light emitting diode to the second control transistor.

While the second light emitting diode emits light, the first control transistor may be turned on and the second control transistor is turned off.

While the second light emitting diode emits light, a driving current may flow from the first control transistor to the second light emitting diode.

The display device may further include a gate driver which is electrically connected to the display panel and outputs a first scan signal, the first control signal, and the second control signal to the plurality of sub pixels. The gate driver may include a plurality of first stages which generates the first scan signal, and a plurality of control signal generating circuits which is connected to output terminals of the plurality of first stages and generates the first control signal and the second control signal to output the first control signal and the second control signal to a first control line and a second control line.

Each of the plurality of control signal generating circuits may include a first circuit which outputs the first control signal and the second control signal to the first control line and the second control line while the first light emitting diode emits light, and a second circuit which outputs the first control signal and the second control signal to the first control line and the second control line while the second light emitting diode emits light, and the first circuit may output the first scan signal as the first control signal and output a gate low voltage as the second control signal and the second circuit may output the gate low voltage as the first control signal and output the first scan signal as the second control signal.

The first circuit may include a first connection transistor having a gate electrode connected to a Q1 node, a source electrode and a drain electrode connected between the output terminals of the plurality of first stages and the first control line, a second connection transistor having a gate electrode connected to the Q1 node and a source electrode and a drain electrode connected between a gate low line and the second control line, and a first auxiliary transistor which transmits a first enable signal to the Q1 node, and the second circuit may include a third connection transistor having a gate electrode connected to a Q2 node, a source electrode and a drain electrode connected between the output terminals of the plurality of first stages and the second control line, a fourth connection transistor having a gate electrode connected to the Q2 node and a source electrode and a drain electrode connected between the gate low line and the first control line, and a second auxiliary transistor which transmits a second enable signal to the Q2 node.

The first enable signal and the second enable signal may be signals with reversed phases.

A turn-on period of the first connection transistor and the second connection transistor and a turn-on period of the third connection transistor and the fourth connection transistor may be configured by turns.

According to another aspect of the present disclosure, a display device includes a substrate, an adhesive layer disposed on the substrate, a first light emitting diode which is disposed on the adhesive layer and includes a first anode and a first cathode, a second light emitting diode which is disposed on the adhesive layer and includes a second anode and a second cathode, and a plurality of reflective electrodes disposed between the substrate and the adhesive layer. The plurality of reflective electrodes includes a first reflective electrode which is electrically connected to the first anode, a second reflective electrode which is electrically connected to the first cathode and the second anode, and a third reflective electrode which is electrically connected to the second cathode.

The display device may further include a first control transistor which is disposed between the substrate and the plurality of reflective electrodes and includes a first control source electrode electrically connected to a high potential power line, a second control transistor which is disposed between the substrate and the plurality of reflective electrodes and includes a second control source electrode electrically connected to a first control drain electrode of the first control transistor, and a driving transistor which is disposed between the substrate and the plurality of reflective electrodes and includes a driving source electrode electrically connected to a second control drain electrode of the second control transistor. The first reflective electrode may be electrically connected to the first control source electrode and the high potential power line, the second reflective electrode is electrically connected to the first control drain electrode and the second control source electrode, and the third reflective electrode may be electrically connected to the second control drain electrode and the driving source electrode.

The display device may further include a planarization layer which covers the first light emitting diode and the second light emitting diode, and a plurality of connection electrodes which is disposed on the planarization layer and electrically connects the first light emitting diode and the second light emitting diode to the plurality of reflective electrodes through a contact hole of the planarization layer. The plurality of connection electrodes may include a first anode connection electrode which electrically connects the first anode and the first reflective electrode, a first cathode connection electrode which electrically connects the first cathode and the second reflective electrode, a second anode connection electrode which electrically connects the second anode and the second reflective electrode, and a second cathode connection electrode which electrically connects the second cathode and the third reflective electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:
- a display panel including a plurality of sub pixels;
- a first light emitting diode in each of the plurality of sub pixels;
- a second light emitting diode that is connected to the first light emitting diode in series;
- a first control transistor that is connected to the first light emitting diode in parallel, the first control transistor turned on by a first control signal;
- a second control transistor that is connected to the second light emitting diode in parallel, the second control transistor turned on by a second control signal; and
- a gate driver that is electrically connected to the display panel, the gate driver configured to output a first scan signal, the first control signal, and the second control signal to the plurality of sub pixels,
- wherein the gate driver includes:
  - a plurality of first stages that generate the first scan signal; and
  - a plurality of control signal generating circuits each of which is connected to an output terminal of a corresponding one of the plurality of first stages and generates the first control signal and the second control signal to output the first control signal and the second control signal to a first control line and a second control line, and
- wherein the first light emitting diode and the second light emitting diode emit light of a same color.

2. The display device according to claim 1, wherein the first light emitting diode and the second light emitting diode emit light by turns.

3. The display device according to claim 2, wherein the first control transistor is turned off and the second control transistor is turned on while the first light emitting diode emits light.

4. The display device according to claim 3, wherein a driving current flows from the first light emitting diode to the second control transistor while the first light emitting diode emits light.

5. The display device according to claim 2, wherein the first control transistor is turned on and the second control transistor is turned off while the second light emitting diode emits light.

6. The display device according to claim 5, wherein a driving current flows from the first control transistor to the second light emitting diode while the second light emitting diode emits light.

7. The display device according to claim 1, wherein each of the plurality of control signal generating circuits includes:

a first circuit that outputs the first control signal and the second control signal to the first control line and the second control line while the first light emitting diode emits light; and a second circuit that outputs the first control signal and the second control signal to the first control line and the second control line while the second light emitting diode emits light, wherein the first circuit outputs the first scan signal as the first control signal and outputs a gate low voltage as the second control signal and the second circuit outputs the gate low voltage as the first control signal and outputs the first scan signal as the second control signal.

8. The display device according to claim 7, wherein the first circuit includes:

a first connection transistor having a gate electrode connected to a first node, a source electrode and a drain electrode connected between the output terminal of a corresponding one of the plurality of first stages and the first control line;

a second connection transistor having a gate electrode connected to the first node and a source electrode and a drain electrode connected between a gate low line and the second control line; and a first auxiliary transistor that transmits a first enable signal to the first node, wherein the second circuit includes:

a third connection transistor having a gate electrode connected to a second node, a source electrode and a drain electrode connected between the output terminal of the corresponding one of the plurality of first stages and the second control line;

a fourth connection transistor having a gate electrode connected to the second node and a source electrode and a drain electrode connected between the gate low line and the first control line; and a second auxiliary transistor that transmits a second enable signal to the second node.

9. The display device according to claim 8, wherein the first enable signal and the second enable signal have reversed phases from each other.

10. The display device according to claim 9, wherein a turn-on period of the first connection transistor and the second connection transistor and a turn-on period of the third connection transistor and the fourth connection transistor are configured by turns.

11. The display device according to claim 8, wherein the first circuit further includes a first boosting capacitor that is connected between the first node and the first control line and the second circuit further includes a second boosting capacitor that is connected between the second node and the second control line.

* * * * *